(12) United States Patent
Imaizumi

(10) Patent No.: US 11,809,078 B2
(45) Date of Patent: Nov. 7, 2023

(54) PHOTOSENSITIVE RESIN COMPOSITION, DRY FILM RESIST, AND CURED OBJECTS OBTAINED THEREFROM

(71) Applicant: Nipppon Kayaku Kabushiki Kaisha, Tokyo (JP)

(72) Inventor: Naoko Imaizumi, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 161 days.

(21) Appl. No.: 16/769,361

(22) PCT Filed: Nov. 29, 2018

(86) PCT No.: PCT/JP2018/043986
§ 371 (c)(1),
(2) Date: Jun. 3, 2020

(87) PCT Pub. No.: WO2019/111796
PCT Pub. Date: Jun. 13, 2019

(65) Prior Publication Data
US 2020/0292938 A1    Sep. 17, 2020

(30) Foreign Application Priority Data
Dec. 6, 2017  (JP) .................................. 2017-234009

(51) Int. Cl.
| | |
|---|---|
| B32B 15/04 | (2006.01) |
| B32B 15/20 | (2006.01) |
| B32B 17/06 | (2006.01) |
| G03F 7/038 | (2006.01) |
| B32B 18/00 | (2006.01) |
| B32B 27/08 | (2006.01) |
| C08G 59/32 | (2006.01) |
| G03F 7/004 | (2006.01) |

(52) U.S. Cl.
CPC ............ *G03F 7/038* (2013.01); *B32B 15/043* (2013.01); *B32B 15/20* (2013.01); *B32B 17/06* (2013.01); *B32B 18/00* (2013.01); *B32B 27/08* (2013.01); *C08G 59/3218* (2013.01); *C08G 59/3281* (2013.01); *G03F 7/0045* (2013.01); *B32B 2457/00* (2013.01)

(58) Field of Classification Search
CPC ..... C08G 59/3218; C08G 59/32; C08G 59/68
See application file for complete search history.

(56) References Cited

U.S. PATENT DOCUMENTS

| | | | | |
|---|---|---|---|---|
| 6,166,233 A | * | 12/2000 | Neckers ..................... | C08F 2/50 522/25 |
| 2005/0260522 A1 | | 11/2005 | Weber et al. | |
| 2015/0301450 A1 | | 10/2015 | Imaizumi et al. | |
| 2017/0102614 A1 | * | 4/2017 | Imaizumi ............... | G03F 7/0758 |
| 2018/0095366 A1 | | 4/2018 | Imai et al. | |
| 2018/0329297 A1 | | 11/2018 | Fukunaga et al. | |

FOREIGN PATENT DOCUMENTS

| | | | |
|---|---|---|---|
| CN | 104756012 A | 7/2015 | |
| CN | 106662814 A | 5/2017 | |
| JP | 2010-32991 A | † 2/2010 | |
| JP | 2010032991 A | * 2/2010 | ......... C08G 59/3218 |
| JP | 4691047 B2 | 6/2011 | |
| JP | 5020646 B2 | 9/2012 | |
| JP | 2014-85626 A | 5/2014 | |
| JP | 2014-210854 A | 11/2014 | |
| JP | 2017048325 A | 3/2017 | |

(Continued)

OTHER PUBLICATIONS sigmaaldrich.com D.E.R.(TM) 332 accessed Apr. 7, 2022.*
International Preliminary Report on Patentability dated Jun. 9, 2020 in corresponding PCT application No. PCT/JP2018/043986.
International Search Report and Written Opinion dated Jan. 15, 2019 in corresponding PCT application No. PCT/JP2018/043986.
Japanese communication, with English translation, dated Apr. 12, 2022 in corresponding Japanese patent application No. 2019-558172.

(Continued)

*Primary Examiner* — Alicia J Weydemeyer
(74) *Attorney, Agent, or Firm* — NIELDS, LEMACK & FRAME, LLC

(57) ABSTRACT

A purpose of the present invention is to provide a photosensitive resin composition which retains satisfactory image resolution and gives cured objects reduced in wet-heat dissolution or contamination and having satisfactory wet-heat adhesiveness. The photosensitive resin composition of the present invention comprises: (A) a cationic photopolymerization initiator which comprises a salt of a cation with an anion represented by formula (1) (wherein $R_1$ to $R_4$ each independently represent a $C1_{-18}$ alkyl or $C_{6-14}$ aryl group, provided that at least one of $R_1$ to $R_4$ represents a $C_{6-14}$ aryl group); and (B) an epoxy compound. $R_1$ to $R_4$ may be each independently either a phenyl group having one or more perfluoroalkyl groups as substituents or a phenyl group having one or more fluorine atoms as substituents. $R_1$ to $R_4$ may be each independently a pentafluorophenyl or bis(trifluoromethyl)phenyl group.

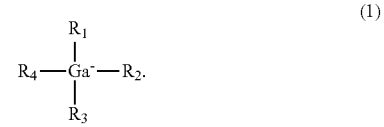

(1)

26 Claims, No Drawings

(56) References Cited

FOREIGN PATENT DOCUMENTS

| JP | 6205522 B2 | 9/2017 | | |
|---|---|---|---|---|
| WO | 02/08309 A2 | 1/2002 | | |
| WO | WO-0208309 A2 | * | 1/2002 | ............ C08G 59/68 |
| WO | WO-2015190476 A1 | * | 12/2015 | ............ C08G 59/62 |

OTHER PUBLICATIONS

Chinese Communication with English translation, dated Dec. 9, 2022, in corresponding Chinese patent application No. 201880076887.9.

Nakajima et al., Design of Cationic Photoinitiator Featuring Excellent Hardening Characteristics and Heat Stability. Konica Minolta Technology Report, vol. 3, pp. 76-79, 2006.
Huiying Li et al., A Novel Initiation System for the Cationic Polymerization of Glycidyl Phenyl Ether: Triphenylcyclopropenium Tetrakis(pentafluorophenyl)gallate/Cyclohexanone, Macromolecules, 34:2019-2021, Mar. 2001.†
Haiyan Gu et al., Cationic UV-Cured Coatings Containing Epoxidized Soybean Oil Initiated by New Onium Salts Containing Tetrakis(pentafluorophenyl)gallate Anion, J. Coat. Technol., 74:49-52, Apr. 2002.†
Haiyan Gu et al., Characterization of Iodonium Salts Differing in the Anion, J. Org. Chem., 66:4161-4164, 2001†

\* cited by examiner
† cited by third party

PHOTOSENSITIVE RESIN COMPOSITION, DRY FILM RESIST, AND CURED OBJECTS OBTAINED THEREFROM

TECHNICAL FIELD

The present invention relates to a photosensitive resin composition, which is useful for producing a micro electromechanical system (MEMS) component, a micromachine component, a microfluidic component, a micro total analysis system (μ-TAS) component, an inkjet printing head component, a microreactor component, an insulating layer of an electronic component such as a capacitor or an inductor, a LIGA component, a die and a stamp for micro injection molding and heat embossing, a screen or a stencil for a fine printing application, a package component of a MEMS sensor, a semiconductor device, a frequency filter device, or the like installed in a portable terminal or an IoT component, a bio-MEMS and a bio-photonic device, and a printed wiring board, has excellent resolution, gives a cured object having an extremely low level of eluted contaminant under humid and heated conditions, and exhibits excellent adhesion to a substrate after a humidity and heat test.

BACKGROUND ART

A photolithographically processable resist has been widely used for a semiconductor, MEMS, and a micromachine application. In such an application, a photolithography process is accomplished by carrying out patterning exposure on a substrate and then developing with a developer to selectively remove an exposed or non-exposed region. The photolithographically processable resist (photoresist) is classified into a positive type in which the exposed portion is soluble to the developer and a negative type in which the exposed portion is insoluble to the developer.

A conventional positive type resist on the basis of a combination of diazonaphthoquinone/novolac is not suited for a use requiring a film thickness. This thickness restriction is due to relatively high absorbance of a diazonaphthoquinone-based photoactive compound at a wavelength in a near infrared region (from 350 to 450 nm) of the optical spectrum typically used for exposing a resist.

On the other hand, as a negative type resist which solves the problem of the positive type resist, there has been proposed a photosensitive epoxy resin composition capable of forming a thick-film pattern, including a multifunctional epoxy resin and a photopolymerization initiator (see Patent literature 1).

Patent literature 1 discloses a photosensitive resin composition which includes a photopolymerization initiator having a specific structure, namely, an antimony compound. This literature describes a method for improving characteristics such as satisfactory image resolution and adhesiveness by using such a photopolymerization initiator having a specific structure. However, although the photopolymerization initiator including an antimony fluoride-based compound exhibits relatively high sensibility, there is a problem of toxicity of antimony. Many antimony compounds are designated as a deleterious substance and have to be on use restrictions. Furthermore, hydrogen fluoride is liberated from the antimony fluoride-based compound under some processing conditions and causes corrosion of a metal part. This unavoidably brings an inconvenience of including an additional step of preventing a corrosion defect. Further, regarding a polymerized cured object obtained by using this initiator, when the cured object alone is subjected to a pressure cooker test (hereinafter, "PCT test") as an indicative of resistance to humidity and heat, the extraction water exhibits strong acidity, and large amounts of liberated hydrogen fluoride, resin oxidative decomposition products, and the like are eluted out.

Patent literatures 2 and 3 propose a photosensitive resin composition containing a cationic photopolymerization initiator containing a non-antimony compound having a specific structure in which the central element of the anion part is boron or phosphorus. These literatures describe that the photosensitive resin composition containing the cationic photopolymerization initiator of the non-antimony compound exhibits sensitivity equal to or greater than that of the photosensitive resin composition containing the cationic photopolymerization initiator of the antimony compound. However, when a cured object of the composition containing the photopolymerization initiator of the non-antimony compound described in these literatures is subjected to the PCT test, the extraction water exhibits a high conductivity and low pH. Such a cured object not only is insufficient in water resistance and resistance to humidity and heat, but also may cause contamination with an acidic eluted substance under a humid and heated environment or an environment requiring water resistance. Thus, the photosensitive resin composition in these literatures is inevitably restricted for applications in which utilizing an aqueous fluid such as a microfluidic component, a micro total analysis system (μ-TAS) component, an inkjet nozzle component, and the like, and for applications in electronic packaging of a frequency filter device installed in a portable information terminal apparatus, a sensor installed in an IoT component, and the like, requiring high resistance to humidity and heat at the time of resin sealing.

CITATION LIST

Patent Literature

PATENT LITERATURE 1: JP-B-4691047
PATENT LITERATURE 2: JP-B-6205522
PATENT LITERATURE 3: JP-B-5020646

SUMMARY OF INVENTION

Technical Problem

The present invention has been made in the above circumstances, and an object thereof is to provide a photosensitive resin composition which retains satisfactory image resolution and gives a cured object reduced in an eluted contaminant under humid and heated conditions, and exhibits satisfactory adhesiveness under humid and heated conditions.

Solution to Problem

Aspects of the present invention to solve the above problem are as follows.

[1].

A photosensitive resin composition comprising a cationic photopolymerization initiator (A) and an epoxy compound (B), in which:

the cationic photopolymerization initiator (A) comprises a salt composed of an anion represented by a following formula (1) and a cation,

in which $R_1$ to $R_4$ each independently denotes an alkyl group having 1 to 18 carbon atom(s) or an aryl group having 6 to 14 carbon atoms, and at least one of $R_1$ to $R_4$ denotes the aryl group having 6 to 14 carbon atoms; and the epoxy compound (B) includes one or two or more kinds of epoxy compounds selected from a group consisting of:

an epoxy compound (b-1) represented by a following formula (2),

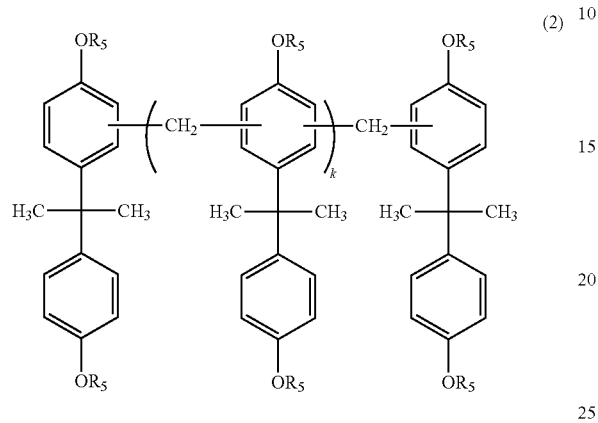

(2)

in which $R_5$ each independently denotes a glycidyl group or a hydrogen atom, at least two of a plurality of $R_5$ are the glycidyl groups, and k is an average repetition number and denotes a real number in a range of from 0 to 30;

an epoxy compound (b-2) represented by a following formula (3),

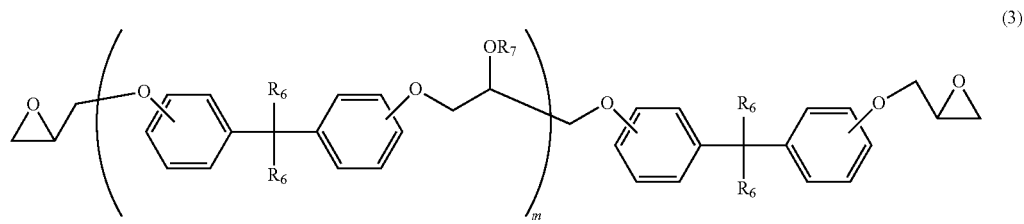

(3)

in which $R_6$ each independently denotes a hydrogen atom, an alkyl group having 1 to 4 carbon atom(s), or a trifluoromethyl group, $R_7$ denotes a hydrogen atom or a glycidyl group, when a plurality of $R_7$ are present, the plurality of $R_7$ may be the same or different from each other, and m is an average repetition number and denotes a real number in a range of from 0 to 30;

an epoxy compound (b-3) represented by a following formula (4),

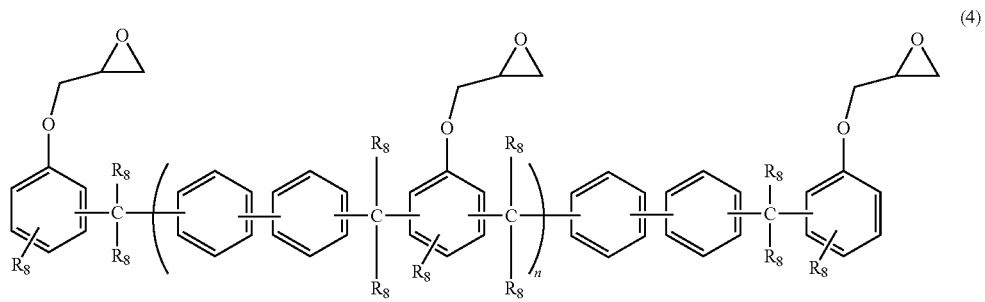

(4)

in which $R_8$ each independently denotes a hydrogen atom or an alkyl group having 1 to 4 carbon atom(s), and n is an average repetition number and denotes a real number in a range of from 0 to 30;
one or more kinds of epoxy compounds (b-4) selected from a group consisting of epoxy compounds represented by following formulae (5) to (7),
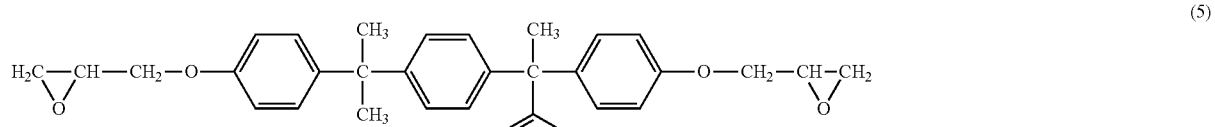
(5)
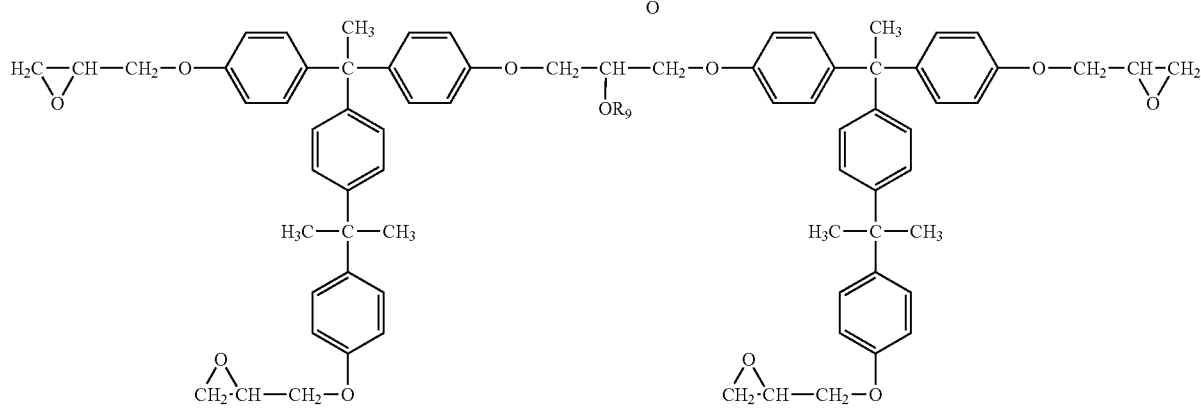
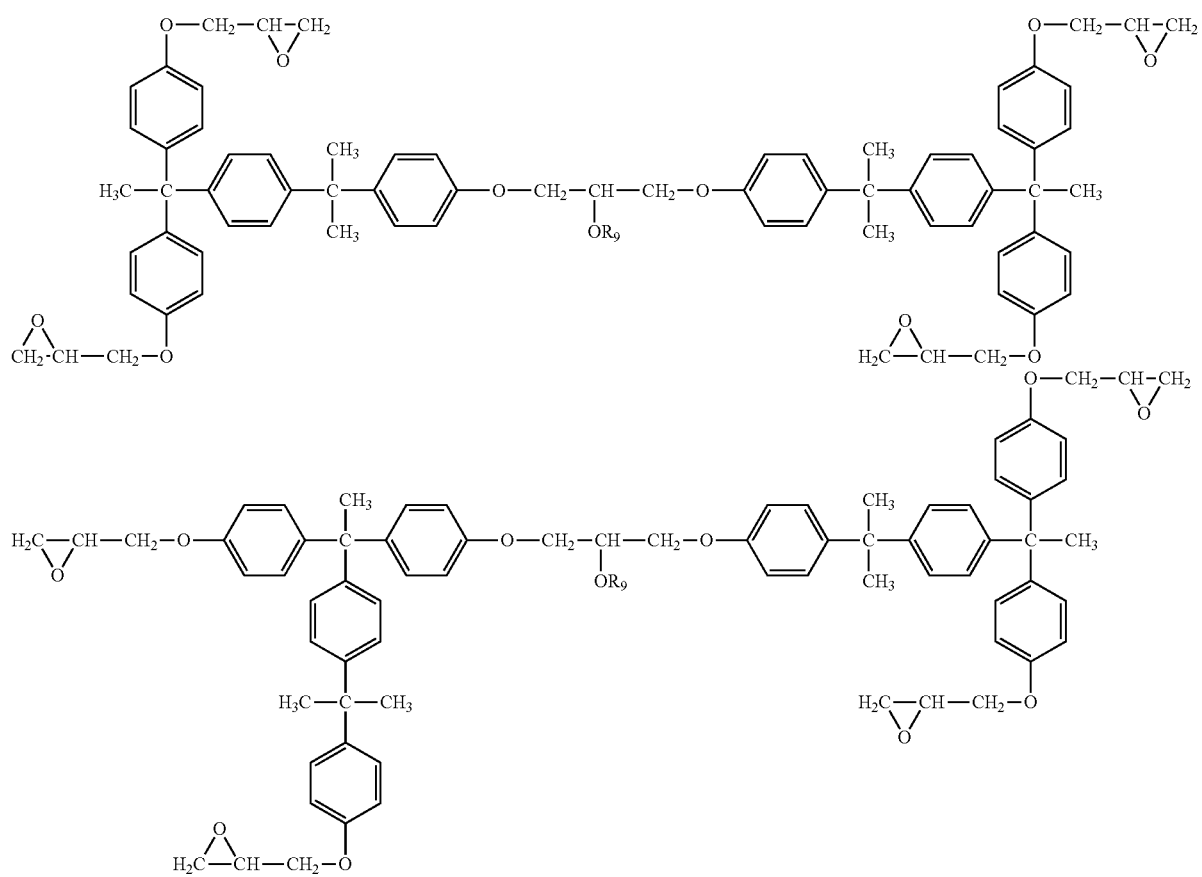
(6)

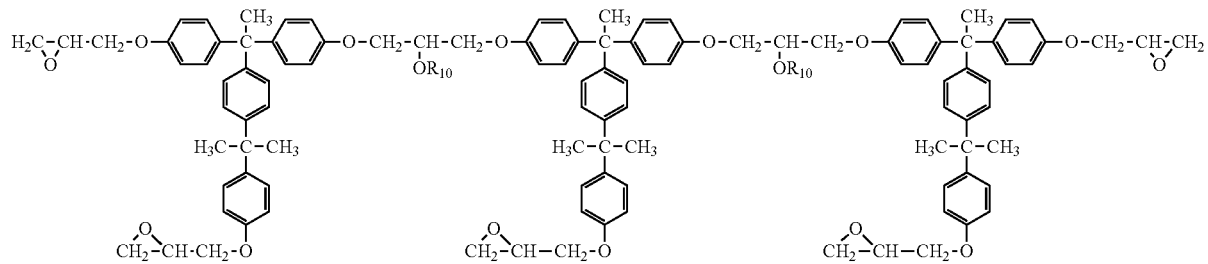
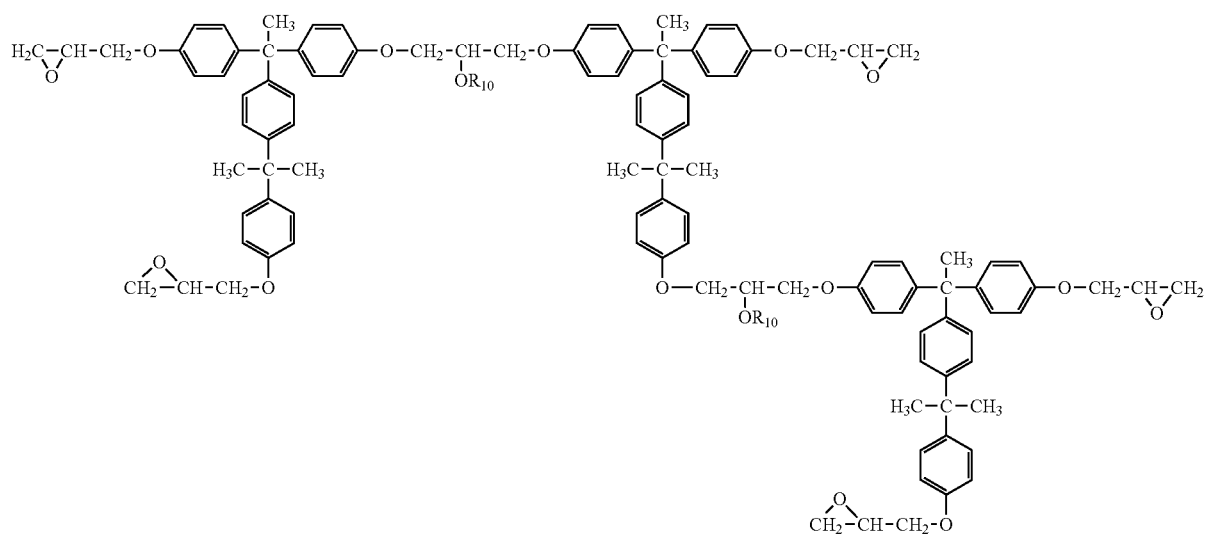
(7)
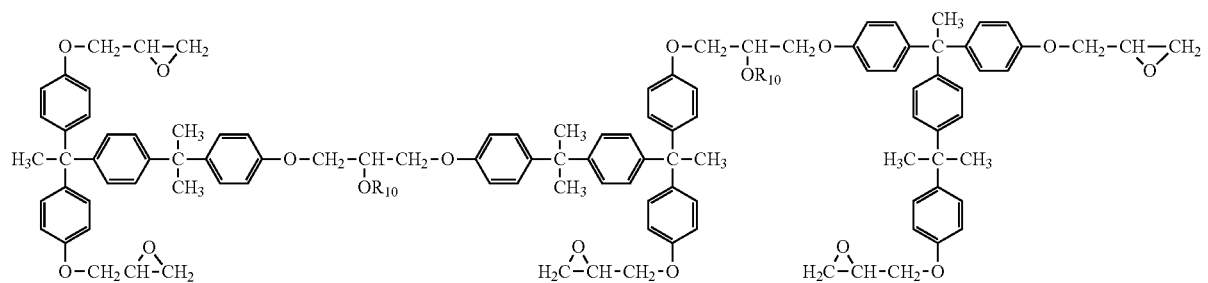
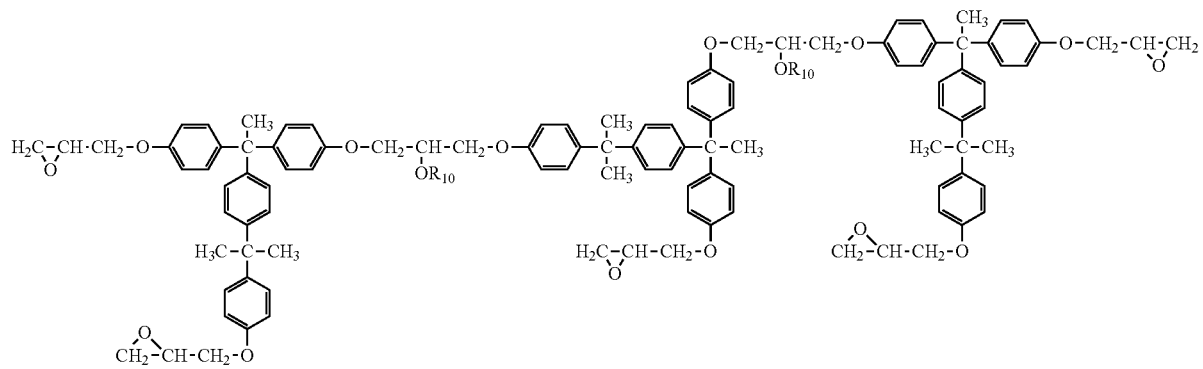

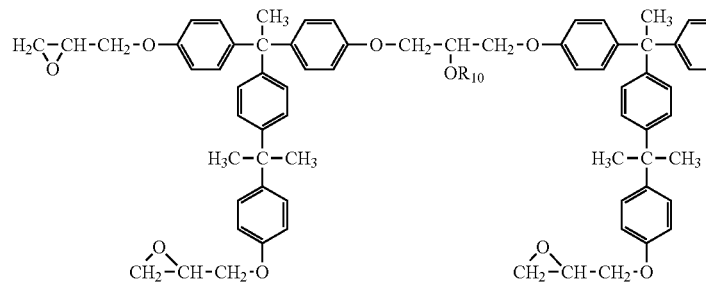

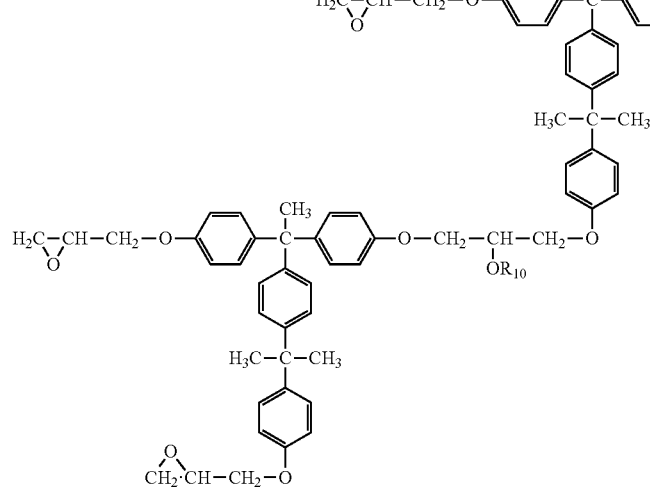

in which, in the formula (6), $R_9$ each independently denotes a hydrogen atom or a glycidyl group, and, in the formula (7), $R_{10}$ each independently denotes a hydrogen atom or a glycidyl group;

an epoxy compound (b-5) that is a co-condensation product of a compound represented by following formula (8) and/or formula (9), and a compound represented by following formula (10) and/or formula (11);

(8)

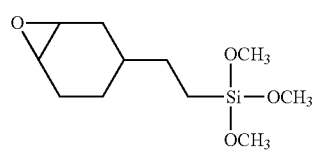

(9)

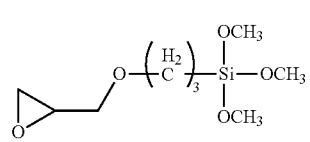

(10)

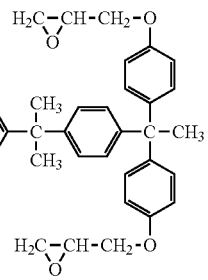

(11)

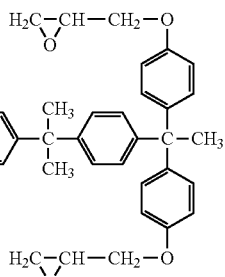

an epoxy compound (b-6) represented by a following formula (12), (12)

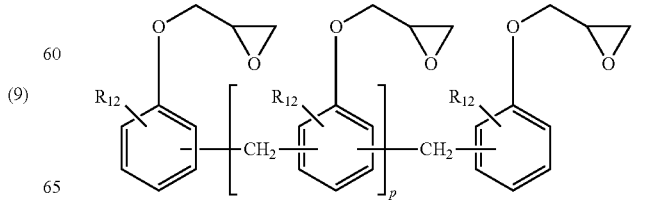

in which $R_{12}$ each independently denotes a hydrogen atom or an alkyl group having 1 to 4 carbon atom(s), and p is an average repetition number and denotes a real number in a range of from 0 to 10;

an epoxy compound (b-7) represented by a following formula (13),

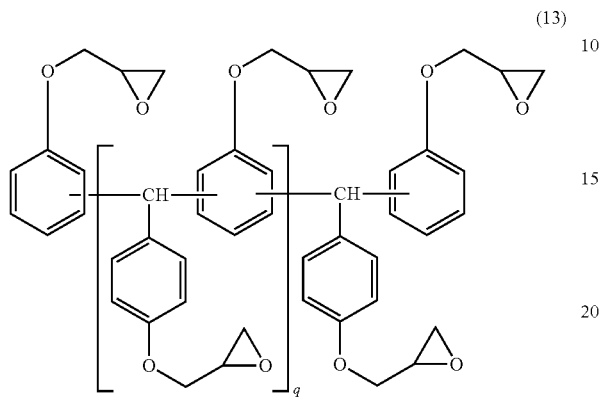

in which q is an average repetition number and denotes a real number in a range of from 0 to 5;

an epoxy compound (b-8) represented by a following formula (14),

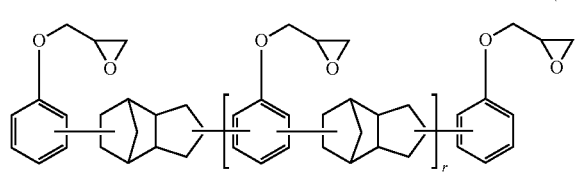

in which r is an average repetition number and denotes a real number in a range of from 0 to 6;

an epoxy compound (b-9) represented by a following formula (15),

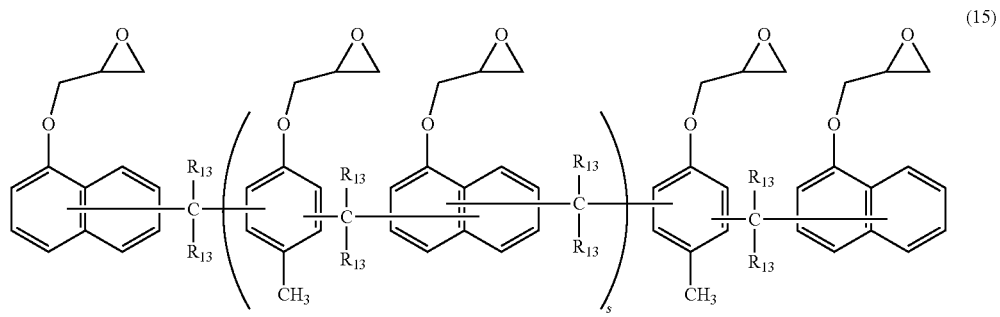

in which $R_{13}$ each independently denotes a hydrogen atom or an alkyl group having 1 to 4 carbon atom(s), and s is an average repetition number and denotes a real number in a range of from 0 to 30; and an epoxy compound (b-10) represented by a following formula (16),

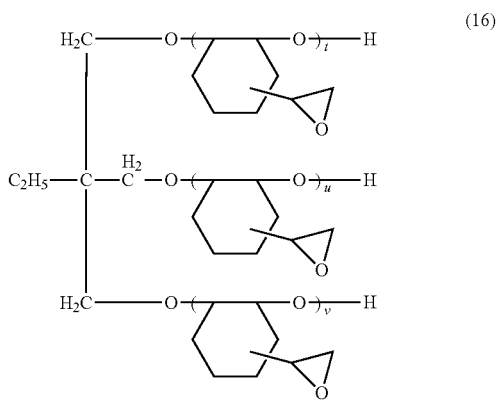

in which t, u and v each is an average repetition number and denotes a real number satisfying a relation of 2≤t+u+v≤60.

[2].

The photosensitive resin composition according to [1], in which $R_1$ to $R_4$ each independently denotes a phenyl group having a perfluoroalkyl group as a substituent or a phenyl group having a fluorine atom as a substituent.

[3]

The photosensitive resin composition according to [2], in which $R_1$ to $R_4$ each independently denotes a pentafluorophenyl group or a bis(trifluoromethyl)phenyl group.

[4].

The photosensitive resin composition according to any one of [1] to [3], in which the cationic photopolymerization initiator (A) comprises the salt composed of the anion represented by the formula (1) and the cation having an iodine atom or a sulfur atom.

[5].

A dry film resist obtained by interposing the photosensitive resin composition according to any one of [1] to [4] between substrates.

[6].

A cured object of the photosensitive resin composition according to any one of [1] to [4] or the dry film resist according to [5].

Advantageous Effects of Invention

The photosensitive resin composition of the present invention has excellent resolution, gives a cured object of the composition having an extremely low level of eluted contaminant under humid and heated conditions, and also exhibits excellent adhesion to a substrate after the humidity and heat test. Thus, it can be suitably used in a MEMS component and the like used in an application using an aqueous fluid and an application requiring high resistance to humidity and heat at the time of resin sealing.

DESCRIPTION OF EMBODIMENTS

The prevent invention will be described below.

A cationic photopolymerization initiator (A) included in a photosensitive resin composition of the present invention includes a salt composed of an anion represented by the above formula (1) and a cation.

In the formula (1), $R_1$ to $R_4$ each independently denotes an alkyl group having 1 to 18 carbon atom(s) or an aryl group having 6 to 14 carbon atoms, and at least one of $R_1$ to $R_4$ denotes the aryl group having 6 to 14 carbon atoms. That is, $R_1$ to $R_4$ in the formula (1) are one of the following combinations.

(i) a combination in which one of $R_1$ to $R_4$ is an aryl group and the other three are alkyl groups.

(ii) a combination in which two of $R_1$ to $R_4$ are aryl groups and the other two are alkyl groups.

(iii) a combination in which three of $R_1$ to $R_4$ are aryl groups and the other one is an alkyl group.

(iv) a combination in which all of $R_1$ to $R_4$ are aryl groups.

Among the above combinations, the anion of (iii) or (iv) is preferable and the anion of (iv) is more preferable.

The alkyl group having 1 to 18 carbon atom(s) represented by $R_1$ to $R_4$ of the formula (1) is not limited to any of a linear, branched, or cyclic form. Specific examples thereof include a methyl group, an ethyl group, an n-propyl group, an iso-propyl group, an n-butyl group, an iso-butyl group, a t-butyl group, an n-pentyl group, an iso-pentyl group, a t-pentyl group, a sec-pentyl group, an n-hexyl group, an iso-hexyl group, an n-heptyl group, a sec-heptyl group, an n-octyl group, an n-nonyl group, a sec-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a cyclopentyl group, and a cyclohexyl group.

The alkyl group having 1 to 18 carbon atom(s) represented by $R_1$ to $R_4$ of the formula (1) may have a substituent. The term "alkyl group having substituent" described herein refers to an alkyl group having in its structure a hydrogen atom substituted with a substituent. The position and the number of the substituent are not particularly limited. Note that, in a case where the substituent has a carbon atom, the carbon number of the alkyl group represented by $R_1$ to $R_4$ does not include the number of carbon atoms included in the substituent. Specifically, for example, in a case of an ethyl group having a phenyl group as a substituent, such an ethyl group is considered as an alkyl group having 2 carbon atoms.

The substituent which may be included in the alkyl group having 1 to 18 carbon atom(s) represented by $R_1$ to $R_4$ of the formula (1) is not particularly limited (note that an alkyl group is excluded), and examples thereof include an alkoxy group, an aromatic group, a heterocyclic group, a halogen atom, a hydroxyl group, a mercapto group, a nitro group, an alkyl-substituted amino group, an aryl-substituted amino group, an unsubstituted amino group ($NH_2$ group), a cyano group, and an isocyano group.

The alkoxy group which may be included as the substituent in the alkyl group having 1 to 18 carbon atom(s) represented by $R_1$ to $R_4$ of the formula (1) is a substituent in which an oxygen atom is bound to an alkyl group. Examples of the alkyl group included in the alkoxy group include the same alkyl groups as described in the section of the alkyl group having 1 to 18 carbon atom(s) represented by $R_1$ to $R_4$ of the formula (1).

The aromatic group which may be included as a substituent in the alkyl group having 1 to 18 carbon atom(s) represented by $R_1$ to $R_4$ of the formula (1) is not particularly limited as long as the aromatic group is a residue obtained by removing one hydrogen atom from an aromatic ring of an aromatic compound. Examples thereof include a phenyl group, a biphenyl group, a terphenyl group, a quaterphenyl group, a tolyl group, an indenyl group, a naphthyl group, an anthryl group, a fluorenyl group, a pyrenyl group, a phenanthryl group, and a mesityl group.

The heterocyclic group which may be included as a substituent in the alkyl group having 1 to 18 carbon atom(s) represented by $R_1$ to $R_4$ of the formula (1) is not particularly limited as long as the heterocyclic group is a residue obtained by removing one hydrogen atom from a heterocyclic ring of a heterocyclic compound. Examples thereof include a furanyl group, a thienyl group, a thienothienyl group, a pyrrolyl group, an imidazolyl group, an N-methylimidazolyl group, a thiazolyl group, an oxazolyl group, a pyridyl group, a pyrazyl group, a pyrimidyl group, a quinolyl group, an indolyl group, a benzopyrazyl group, a benzopyrimidyl group, a benzothienyl group, a naphthothienyl group, a benzofuranyl group, a benzothiazolyl group, a pyridinothiazolyl group, a benzoimidazolyl group, a pyridinoimidazolyl group, an N-methylbenzoimidazolyl group, a pyridino-N-methylimidazolyl group, a benzooxazolyl group, a pyridinooxazolyl group, a benzothiadiazolyl group, a pyridinothiadiazolyl group, a benzooxadiazolyl group, a pyridinooxadiazolyl group, a carbazolyl group, a phenoxazinyl group, and a phenothiazinyl group.

Specific examples of the halogen atom which may be included as a substituent in the alkyl group having 1 to 18 carbon atom(s) represented by $R_1$ to $R_4$ of the formula (1) include a fluorine atom, a chlorine atom, a bromine atom, and an iodine atom.

The alkyl-substituted amino group which may be included as a substituent in the alkyl group having 1 to 18 carbon atom(s) represented by $R_1$ to $R_4$ of the formula (1) is not limited to either of a monoalkyl-substituted amino group or a dialkyl-substituted amino group. Examples of the alkyl group in these alkyl-substituted amino groups include the same alkyl groups as described in the section of the alkyl group having 1 to 18 carbon atom(s) represented by $R_1$ to $R_4$ of the formula (1).

The aryl-substituted amino group which may be included as a substituent in the alkyl group having 1 to 18 carbon atom(s) represented by $R_1$ to $R_4$ of the formula (1) is not limited to either of a monoaryl-substituted amino group or a diaryl-substituted amino group. Examples of the aryl group in these aryl-substituted amino groups include the same aromatic groups as those which may be included as a substituent in the alkyl group having 1 to 18 carbon atom(s) represented by $R_1$ to $R_4$ of the formula (1).

Specific examples of the aryl group having 6 to 14 carbon atoms represented by $R_1$ to $R_4$ of the formula (1) include the same aromatic groups as those which may be included as a substituent in the alkyl group having 1 to 18 carbon atom(s) represented by $R_1$ to $R_4$ of the formula (1).

The aryl group having 6 to 14 carbon atoms represented by $R_1$ to $R_4$ of the formula (1) may have a substituent. The term "aryl group having substituent" described herein refers to an aryl group having in its structure a hydrogen atom substituted with a substituent. The position and the number of the substituent are not particularly limited. Note that, in a case where the substituent has a carbon atom, the carbon number of the aryl group represented by $R_1$ to $R_4$ does not include the number of carbon atoms included in the substituent. Specifically, for example, in a case of a phenyl group having an ethyl group as a substituent, such a phenyl group is considered as an aryl group having 6 carbon atoms.

The substituent which may be included in the aryl group having 6 to 14 carbon atoms represented by $R_1$ to $R_4$ of the formula (1) is not particularly limited, however, examples thereof include an alkyl group, an alkoxy group, an aromatic group, a heterocyclic group, a halogen atom, a hydroxyl group, a mercapto group, a nitro group, an alkyl-substituted amino group, an aryl-substituted amino group, an unsubstituted amino group ($NH_2$ group), a cyano group, and an isocyano group.

Examples of the alkyl group which may be included as the substituent in the aryl group having 6 to 14 carbon atoms represented by $R_1$ to $R_4$ of the formula (1) include the same alkyl groups as described in the section of the alkyl group having 1 to 18 carbon atom(s) represented by $R_1$ to $R_4$ of the formula (1).

Specific examples of the alkoxy group, the aromatic group, the heterocyclic group, the halogen atom, the alkyl-substituted amino group, and the aryl-substituted amino group, which may be included as a substituent in the aryl group having 6 to 14 carbon atoms represented by $R_1$ to $R_4$ of the formula (1) include, respectively, the same alkoxy groups, aromatic groups, heterocyclic groups, halogen atoms, alkyl-substituted amino groups, and aryl-substituted amino groups as those which may be included as a substituent in the alkyl group having 1 to 18 carbon atom(s) represented by $R_1$ to $R_4$ of the formula (1).

As $R_1$ to $R_4$ of the formula (1), the alkyl group of 1 to 18 carbon atom(s) having a halogen atom as a substituent or the aryl group of 6 to 14 carbon atoms having a halogen atom as a substituent is preferable, and the alkyl group of 1 to 18 carbon atom(s) having a fluorine atom as a substituent or the aryl group of 6 to 14 carbon atoms having a fluorine atom as a substituent is more preferable.

The cation forming the salt with the anion represented by the formula (1) is not particularly limited as long as it is a monovalent positive ion. However, as the cation, an oxonium ion, an ammonium ion, a phosphonium ion, a sulfonium ion, or an iodonium ion is preferable, an ammonium ion, a phosphonium ion, a sulfonium ion, or an iodonium ion is more preferable, and a sulfonium ion or an iodonium ion is further more preferable.

Examples of the oxonium ion include, for instance, an oxonium such as trimethyloxonium, diethylmethyloxonium, triethyloxonium, or tetramethylenemethyloxonium, a pyrylium such as 4-methylpyrylium, 2,4,6-trimethylpyrylium, 2,6-di-tert-butylpyrylium, or 2,6-diphenylpyrylium, and a chromenium or an isochromenium such as 2,4-dimethylchromenium and 1,3-dimethylisochromenium.

Examples of the ammonium ions include, for instance, pyrrolidinium ions, such as, N,N-dimethyl pyrrolidinium, N-ethyl-N-methyl pyrrolidinium and N,N-diethyl pyrrolidinium; imidazolinium ions, such as, N,N'-dimethylimidazolinium, N,N'-diethyl imidazolinium, N-ethyl-N'-methyl-imidazolinium, 1,3,4-trimethylimidazolinium, and 1,2,3,4-tetramethylimidazolinium; tetrahydropyrimidinium ions, such as, N,N'-dimethyl tetrahydropyrimidinium; morpholinium ion, such as, N,N'-dimethyl morpholinium; piperidinium ions, such as, N,N-diethyl piperidinium; pyridinium ions, such as, N-methyl pyridinium, N-benzyl pyridinium and N-phenacyl pyridium; imidazolium ions, such as, N,N'-dimethyl imidazolium; quinolinium ions, such as, N-methyl quinolinium, N-benzyl quinolinium and N-phenacyl quinolinium; isoquinolinium ions, such as, N-methyl isoquinolinium; thiazonium ions, such as, benzyl benzothiazonium and phenacyl benzothiazonium; acrydinium ions, such as, benzyl acrydinium and phenacyl acrydium.

Examples of the phosphonium ion include, for instance, tetraaryl phosphonium ions, such as, tetraphenyl phosphonium, tetra-p-tolyl phosphonium, tetrakis(2-methoxyphenyl) phosphonium, tetrakis(3-methoxyphenyl) phosphonium and tetrakis(4-methoxyphenyl) phosphonium; triaryl phosphonium ions, such as, triphenylbenzyl phosphonium, triphenylphenacyl phosphonium, triphenylmethyl phosphonium and triphenyl butyl phosphonium; tetraalkyl phosphonium ions, such as, triethylbenzyl phosphonium, tributylbenzyl phosphonium, tetraethyl phosphonium, tetrabutyl phosphonium, tetrahexyl phosphonium, triethylphenacyl phosphonium and tributylphenacyl phosphonium, and the like.

Examples of sulfonium ions include, for instance: triaryl sulfonium ions, such as, triphenyl sulfonium, tri-p-tolyl sulfonium, tri-o-tolyl sulfonium, tris(4-methoxyphenyl) sulfonium, 1-naphthyldiphenyl sulfonium, 2-naphthyldiphenyl sulfonium, tris(4-fluorophenyl) sulfonium, tri-1-naphthyl sulfonium, tri-2-naphthyl sulfonium, tris(4-hydroxyphenyl) sulfonium, 4-(phenylthio) phenyldiphenyl sulfonium, 4-(p-tolylthio) phenyldi-p-tolyl sulfonium, 4-(4-methoxyphenylthio) phenyl bis(4-methoxyphenyl) sulfonium, 4-(phenylthio) phenyl bis (4-fluorophenyl) sulfonium, 4-(phenylthio) phenyl bis (4-methoxyphenyl) sulfonium, 4-(phenylthio) phenyldi-p-tolyl sulfonium, [4-(4-biphenylylthio)phenyl]-4-biphenylylphenylsulfonium, [4-(2-thioxanthonylthio)phenyl]diphenylsulfonium, bis[4-(diphenylsulfonio)phenyl]sulfide, bis[4-{bis[4-(2-hydroxyethoxy) phenyl]sulfonio}phenyl]sulfide, bis{4-[bis (4-fluorophenyl) sulfonio]phenyl}sulfide, bis{4-[bis (4-methylphenyl) sulfonio]phenyl}sulfide, bis{4-[bis (4-methoxyphenyl) sulfonio] phenyl}sulfide, 4-(4-benzoyl-2-chlorophenylthio) phenyl bis (4-fluorophenyl) sulfonium, 4-(4-benzoyl-2-chlorophenylthio) phenyldiphenyl sulfonium, 4-(4-benzoylphenylthio) phenyl bis (4-fluorophenyl) sulfonium, 4-(4-benzoylphenylthio) phenyldiphenyl sulfonium, 7-isopropyl-9-oxo-10-thia-9,10-dihydro anthracene-2-yldi-p-tolyl sulfonium, 7-isopropyl-9-oxo-10-thia-9,10-dihydro anthracene-2-yldiphenyl sulfonium, 2-[(di-p-tolyl) sulfonio] thioxanthone, 2-[(diphenyl) sulfonio] thioxanthone, 4-(9-oxo-9H-thioxanthen-2-yl)thiophenyl-9-oxo-9H-thioxanthen-2-ylphenylsulfonium, 4-[4-(4-tert-butylbenzoyl) phenylthio] phenyldi-p-tolyl sulfonium, 4-[4-(4-tert-butylbenzoyl) phenylthio]phenyldiphenyl sulfonium, 4-[4-(benzoylphenylthio)]phenyldi-p-tolyl sulfonium, 4-[4-(benzoylphenylthio)]phenyldiphenyl sulfonium, 5-(4-methoxyphenyl) thioanthrenium, 5-phenylthioanthrenium, 5-tolylthioanthrenium, 5-(4-ethoxy phenyl) thioanthrenium and 5-(2,4,6-trimethylphenyl) thioanthrenium; diaryl sulfonium ions, such as, diphenylphenacyl sulfonium, diphenyl (4-nitrophenacyl) sulfonium, diphenylbenzyl sulfonium and diphenylmethyl sulfonium; monoaryl sulfonium ions, such as, phenylmethylbenzyl sulfonium, 4-hydroxyphenylmethylbenzyl sulfonium, 4-methoxyphenylmethylbenzyl sulfonium, 4-aceto carbonyloxy phenylmethylbenzyl sulfonium, 4-hydroxyphenyl(2-naphthylmethyl)methylsulfonium, 2-naphthylmethylbenzylsulfonium, 2-naphthylmethyl (1-ethoxy carbonyl) ethyl sulfonium, phenylmethylphenacyl sulfonium, 4-hydroxyphenylmethylphenacyl sulfonium, 4-methoxyphenylmethylphenacyl sulfonium, 4-aceto carbonyloxy phenylmethylphenacyl sulfonium, 2-naphthylmethylphenacyl sulfonium, 2-naphthyl octadecylphenacyl sulfonium and 9-anthracenyl methylphenacyl sulfonium; trialkyl sulfonium ions, such as, dimethylphenacyl sulfonium, phenacyl tetrahydro thiophenium, dimethylbenzyl sulfonium, benzyl tetrahydro thiophenium and octadecylmethylphenacyl sulfonium, and the like.

Examples of iodonium ions include, for instance, diphenyl iodonium, di-p-tolyl iodonium, bis (4-dodecylphenyl) iodonium, bis (4-methoxyphenyl) iodonium, (4-octyloxy phenyl) phenyl iodonium, bis (4-decyloxy phenyl) iodonium, 4-(2-hydroxy tetradecyloxy) phenyl iodonium, 4-isopropylphenyl (p-tolyl) iodonium, 4-isobutylphenyl (p-tolyl) iodonium and the like.

The salt composed of the anion represented by the formula (1) and the cation can be synthesized, for example, in accordance with a publicly known method described in JP-A-2013-043864 or the like. Further, a commercially available CPI-310FG (trade name, cationic photopolymerization initiator, manufactured by San-Apro Ltd.) or the like may be purchased for use.

Specific examples of a salt composed of an anion represented by the formula (1) and a cation included in a cationic photopolymerization initiator (A) included in a photosensitive resin composition of the present invention are illustrated below, however, they are not limited thereto.

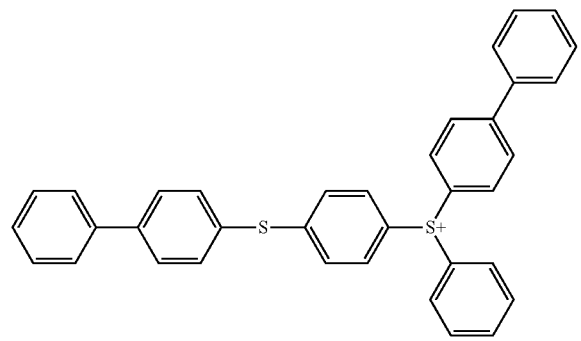

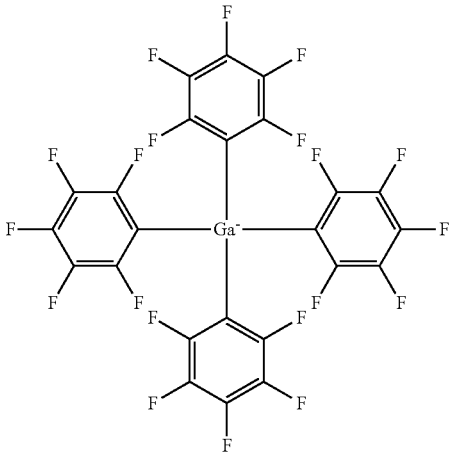

No. 1

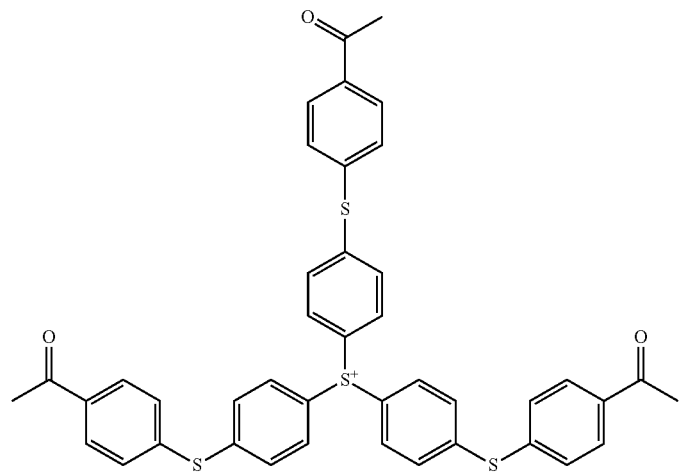

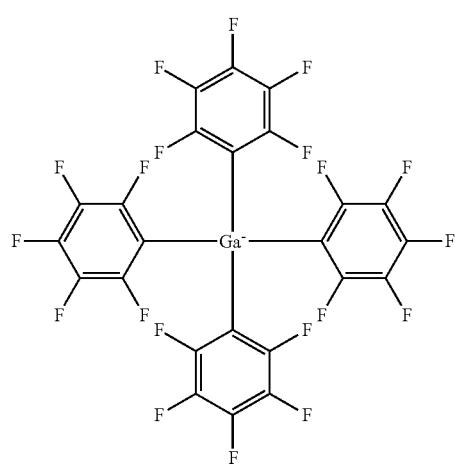

No. 2

-continued
No. 3
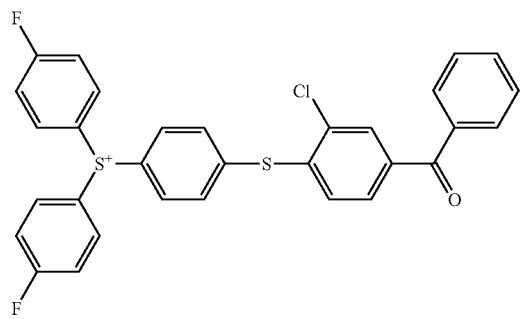
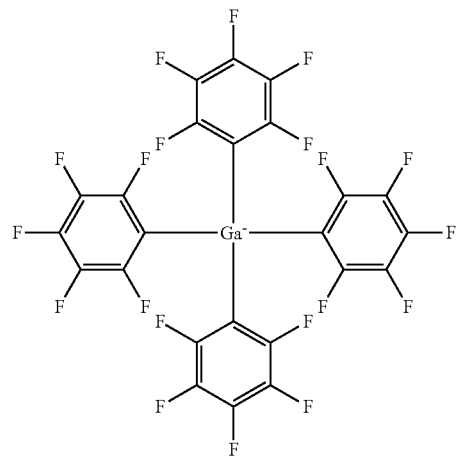
No. 4
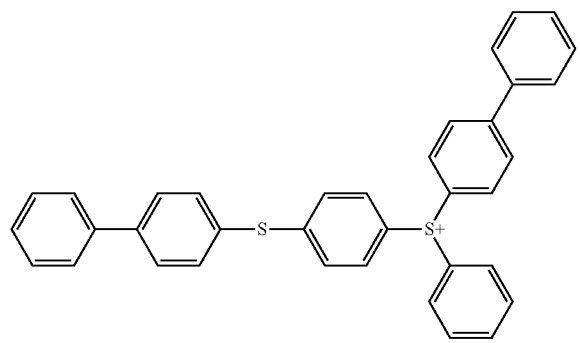
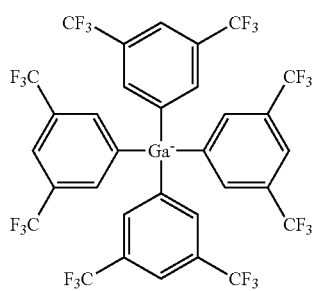
No. 5
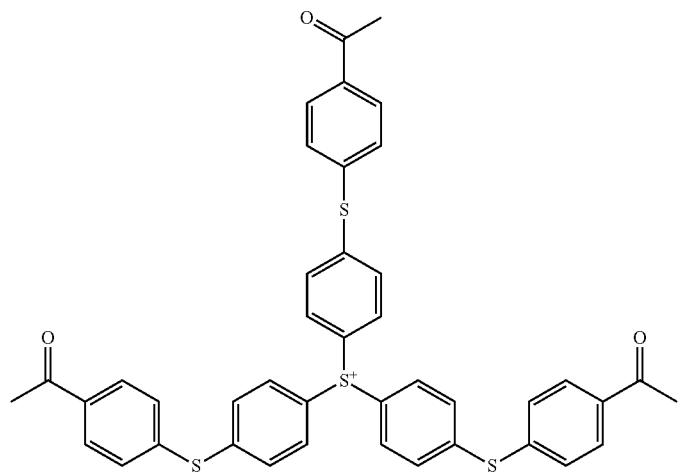
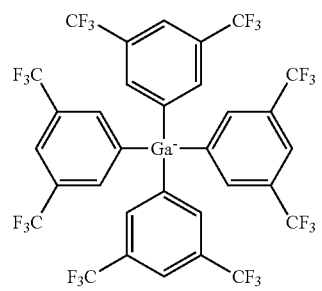
No. 6
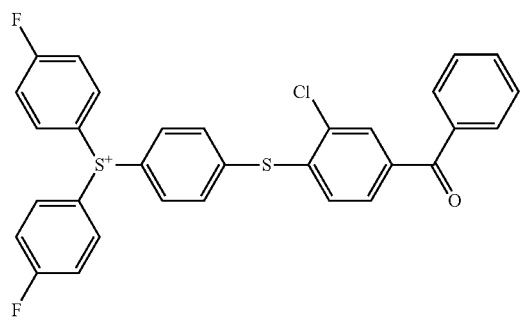
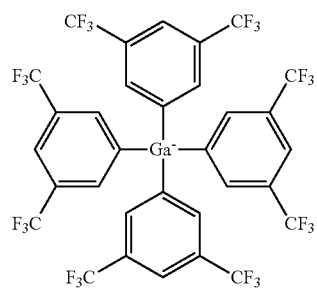

No. 7
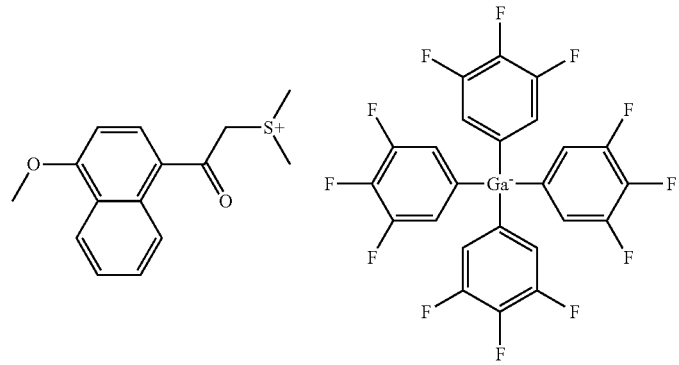
No. 8
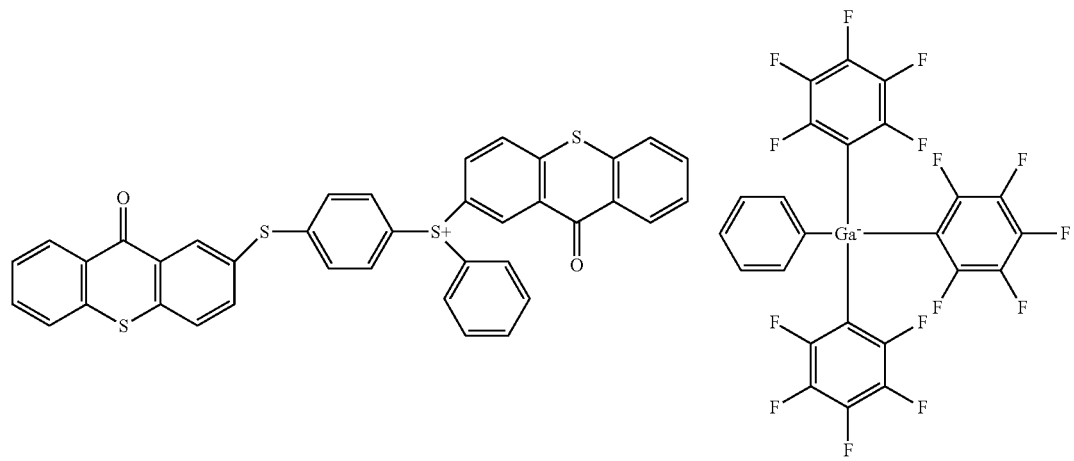
No. 9
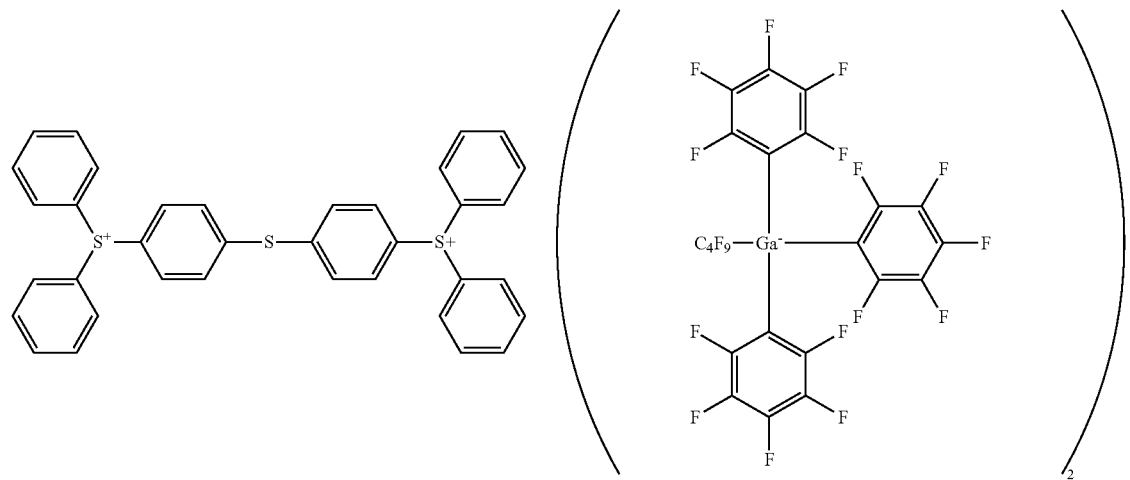

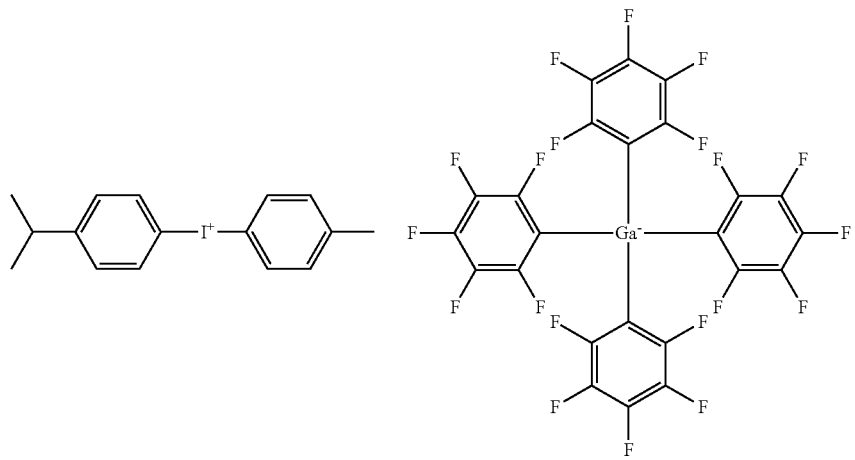

No. 10

The content of the cationic photopolymerization initiator (A) in the photosensitive resin composition of the present invention is preferably from 0.05 to 15% by mass, more preferably from 0.07 to 10% by mass, further more preferably from 0.1 to 8% by mass, most preferably from 0.5 to 5% by mass, with respect to the content of the epoxy compound (B). In a case where the molar absorption coefficient of the cationic photopolymerization initiator (A) at a wavelength from 300 to 380 nm is high, the blending amount may be appropriately controlled depending on the volume or thickness where the photosensitive resin composition is used.

Further, the content of the salt composed of the anion represented by the formula (1) and the cation in the cationic photopolymerization initiator (A) is not particularly limited as long as the effect of the present invention is not impaired. However, the content is preferably 80% by mass or more, more preferably 90% by mass or more, still more preferably 95% by mass or more, most preferably 100%.

The epoxy compound (B) included in the photosensitive resin composition of the present invention includes one or two or more kinds of the epoxy compounds selected from the group consisting of the epoxy compounds (b-1) to (b-10) described above.

Specific examples of the epoxy compound (b-1) include KM-N LCL (trade name, bisphenol A novolac epoxy resin, manufactured by Nippon Kayaku Co., Ltd., epoxy equivalent of from 195 to 210 g/eq., softening point of from 78 to 86° C.), jER157 (trade name, bisphenol A novolac epoxy resin, manufactured by Mitsubishi Chemical Corp., epoxy equivalent of from 200 to 220 g/eq., softening point of 70° C.), and EPON SU-8 (trade name, bisphenol A novolac epoxy resin, manufactured by Hexion Inc., epoxy equivalent of from 195 to 230 g/eq., softening point of from 80 to 90° C.).

Examples of the epoxy compound (b-2) include a bisphenol A epoxy compound, a bisphenol F epoxy compound, and these epoxy compounds with part or all of alcoholic hydroxy groups present in their structures being epoxidized. Specific examples of the bisphenol A epoxy compound include YD series manufactured by Nippon Steel & Sumikin Chemical Co., Ltd, jER828 series and jER1000 series manufactured by Mitsubishi Chemical Corp., EPICLON series (the epoxy equivalent and the softening point thereof vary widely depending on a difference in the average repetition number) manufactured by DIC Corp. Specific examples of the bisphenol F epoxy compound include YDF series manufactured by Nippon Steel & Sumikin Chemical Co., Ltd, jER800 series and jER4000 series manufactured by Mitsubishi Chemical Corp., and EPICLON series (the epoxy equivalent and the softening point thereof vary widely depending on a difference in the average repetition number) manufactured by DIC Corp. Further, specific examples of the bisphenol A epoxy compound and the bisphenol F epoxy compound, with part or all of the alcoholic hydroxy groups present in their structures being epoxidized, include NER-7604 and NER-7403 (both trade names, manufactured by Nippon Kayaku Co., Ltd., epoxy equivalent of from 200 to 500 g/eq., softening point of from 55 to 80° C.) and NER-1302 and NER-7516 (both trade names, manufactured by Nippon Kayaku Co., Ltd., epoxy equivalent of from 200 to 500 g/eq., softening point of from 55 to 80° C.).

Note that, in the present description, the repetition number of structural units in an epoxy compound indicates a value which is calculated from the number average molecular weight calculated in terms of polystyrene on the basis of the GPC measurement result and a general formula. The repetition number of the epoxy compound used in Example described later is a value calculated by this method.

Specific examples of the epoxy compound (b-3) include NC-3000 series such as NC-3000H (trade name, biphenylphenol novolac epoxy resin, manufactured by Nippon Kayaku Co., Ltd., epoxy equivalent of from 270 to 300 g/eq., softening point of from 55 to 75° C.).

Specific examples of the epoxy compound (b-4) include NC-6300H (trade name, manufactured by Nippon Kayaku Co., Ltd., epoxy equivalent of from 226 to 238 g/eq., softening point of from 67 to 74° C.).

The epoxy compound (b-5) can be obtained, for example, by the method described in JP-A-2007-291263.

Specific examples of the epoxy compound (b-6) include EPPN-201 (trade name, manufactured by Nippon Kayaku Co., Ltd., epoxy equivalent of from 180 to 200 g/eq., softening point of from 65 to 78° C.) and EOCN-1020 series such as EOCN-1020-70 (trade name, manufactured by Nippon Kayaku Co., Ltd., epoxy equivalent of from 190 to 210 g/eq., softening point of from 55 to 85° C.).

Specific examples of the epoxy compound (b-7) include EPPN-501H (trade name, manufactured by Nippon Kayaku Co., Ltd., epoxy equivalent of from 162 to 172 g/eq., softening point of from 51 to 57° C.), EPPN-501HY (trade name, manufactured by Nippon Kayaku Co., Ltd., epoxy equivalent of from 163 to 175 g/eq., softening point of 57 to 63° C.), and EPPN-502H (trade name, manufactured by Nippon Kayaku Co., Ltd., epoxy equivalent of from 158 to 178 g/eq., softening point of from 60 to 72° C.).

Specific examples of the epoxy compound (b-8) include XD-1000 (trade name, manufactured by Nippon Kayaku Co., Ltd., epoxy equivalent of from 245 to 260 g/eq., softening point of from 68 to 78° C.).

Specific examples of the epoxy compound (b-9) include NC-7700 (trade name, manufactured by Nippon Kayaku Co., Ltd., epoxy equivalent of from 210 to 250 g/eq., softening point of from 86 to 91° C.).

Specific examples of the epoxy compound (b-10) include EHPE3150 (trade name, manufactured by Daicel Corporation, epoxy equivalent of from 170 to 190 g/eq., softening point of from 70 to 90° C.).

The epoxy equivalent and the molecular weight of the epoxy compound (B) included in the photosensitive resin composition of the present invention are not particularly limited. The softening point thereof is not particularly limited, either. In a case where the dry film resist described later is used by making a direct contact with a photomask, the softening point of the epoxy compound (B) is preferably 40° C. or higher, more preferably 55° C. or higher, for preventing the sticking of the photomask.

Note that the epoxy equivalent in the present description is a value measured by a method in accordance with JIS K7236. The molecular weight in the present description is a value of the weight-average molecular weight calculated in terms of polystyrene on the basis of the measurement result of gel permeation chromatography. The softening point in the present description is a value measured by a method in accordance with JIS K7234.

If necessary, a component such as an epoxy compound other than the epoxy compounds (b-1) to (b-10), a solvent, an adhesiveness imparting agent, a polyol compound, a polyhydric phenol compound, a sensitizer, or an ion catcher can be optionally selected and used with the photosensitive resin composition of the present invention. The optional component usable in combination is not particularly limited as long as the function/effect of the photosensitive resin composition is not impaired.

The epoxy compound other than the epoxy compounds (b-1) to (b-10), usable in combination with the photosensitive resin composition of the present invention, is not particularly limited. For example, a publicly known glycidyl ether epoxy compound and an alicyclic epoxy compound can be used. A substance usually called a reactive diluent, such as diethylene glycol diglycidyl ether, hexanediol diglycidyl ether, dimethylolpropane diglycidyl ether, polypropyleneglycol diglycidyl ether (manufactured by ADEKA Corp., ED506), trimethylolpropane triglycidyl ether (manufactured by ADEKA Corp., ED505), trimethylolpropane triglycidyl ether (low chlorine content, manufactured by Nagase ChemteX Corp., EX321L), pentaerythritol tetraglycidyl ether, or the like is effective, for example, for improving reactivity of the photosensitive resin composition and physical properties of the cured film when used in combination.

The content of the epoxy compound as the optional component in the photosensitive resin composition of the present invention is not particularly limited as long as it is within a range in which the effect of the present invention is not impaired. The optional epoxy compound is preferably used in an amount of 10% by mass or less of the solid content of the photosensitive resin composition excluding the solvent.

The solvent usable in combination with the photosensitive resin composition of the present invention is not particularly limited. However, the solvent, which is an organic solvent usually used in an ink, a coating material, or the like and capable of dissolving each component of the photosensitive resin composition, is preferably used. Examples of such an organic solvent include a ketone such as acetone, ethyl methyl ketone, methyl isobutyl ketone, cyclohexanone, or cyclopentanone, an aromatic hydrocarbon such as toluene, xylene, methoxybenzene, or tetramethylbenzene, a glycol ether such as diglyme, dipropylene glycol dimethyl ether, or dipropylene glycol diethyl ether, an ester such as ethyl lactate, butyl lactate, propyl lactate, ethyl acetate, methyl acetoacetate, ethyl acetoacetate, methyl propionate, ethyl propionate, propyl propionate, isopropyl propionate, methyl 2-hydroxypropanoate, ethyl 2-hydroxypropanoate, methyl-3-methoxypropionate, ethyl-3-methoxypropionate, ethyl-3-ethoxypropionate, propyl-3-methoxypropionate, butyl acetate, butyl cellosolve acetate, carbitol acetate, or propyleneglycol monomethylether acetate, a lactone such as α-acetolactone, β-propiolactone, γ-butyrolactone, or δ-valerolactone, an alcohol such as methanol, ethanol, cellosolve, or methyl cellosolve, an aliphatic hydrocarbon such as octane or decane, and a petroleum solvent such as petroleum ether, petroleum naphtha, hydrogenated petroleum naphtha, or solvent naphtha. These solvents may be used singly or in a mixture of two or more.

The content of the solvents in the photosensitive resin composition of the present invention is not particularly limited as long as it is within a range in which the effect of the present invention is not impaired. The solvent is used normally an amount of 95% by mass or less, preferably 10 to 90% by mass of the photosensitive resin composition.

The adhesiveness imparting agent usable in combination with the photosensitive resin composition of the present invention is not particularly limited. For example, a publicly known silane coupling agent, titanium-coupling agent, or the like can be used. A silane coupling agent is preferable. These adhesiveness imparting agents may be used singly or in a mixture of two or more.

Specific examples of the silane coupling agent include 3-chloropropyltrimethoxysilane, vinyltrichlorosilane, vinyltriethoxysilane, vinyltrimethoxysilane, vinyltris(2-methoxyethoxy)silane, 3-methacryloxypropyltrimethoxysilane, 2-(3,4-epoxycyclohexyl)ethyltrimethoxysilane, 3-glycidoxypropyltrimethoxysilane, 3-glycidoxypropyltriethoxysilane, 3-glycidoxypropylmethyldimethoxysilane, 3-glycidoxypropylmethyldiethoxysilane, 3-mercaptopropyltrimethoxysilane, and 8-glycidyloctyltrimethoxysilane. These coupling agents may be used singly or in a mixture of two or more.

The content of the adhesiveness imparting agent in the photosensitive resin composition of the present invention is not particularly limited as long as it is within a range in which the effect of the present invention is not impaired. The adhesiveness imparting agent is preferably used in an amount of 15% by mass or less, more preferably 10% by mass or less of the solid content of the photosensitive resin composition excluding the solvent.

The polyol compound usable in combination with the photosensitive resin composition of the present invention is not particularly limited. However, it is typically a polyester polyol compound having a hydroxy group that reacts with an epoxy group under an effect of a strong acid catalyst. For example, a polyol compound mentioned in JP-B-5901070 can be used in combination. By using this, it becomes possible to avoid stress induction in an exposure curing step, a developing step, and a heat curing step at the time of the photolithography process and thus reduce shrinkage, thereby making it possible to prevent a crack in a photosensitized image. The content of the polyol compound in the photosensitive resin composition of the present invention is not particularly limited as long as it is within a range in which the effect of the present invention is not impaired. However, it is usually from 1 to 30% by mass, preferably from 2 to 25% by mass, with respect to the total mass of the epoxy compound (B).

The polyhydric phenol compound usable in combination with the photosensitive resin composition of the present invention is a compound capable of curing an epoxy compound with a high crosslinking density by heating. For example, a polyhydric phenol compound mentioned in JP-B-5967824 can be used in combination. By using this, it becomes possible to provide functions of low humidity permeability, high adhesivity, and high toughness to the resin cured object. The content of the polyhydric phenol compound in the photosensitive resin composition of the present invention is not particularly limited as long as it is within a range in which the effect of the present invention is not impaired. However, it is usually from 3 to 40% by mass, preferably from 4 to 30% by mass, still more preferably 5 to 25% by mass with respect to the total mass of the epoxy compound (B).

As the sensitizer usable in combination with the photosensitive resin composition of the present invention, any sensitizer acting a role of providing absorbed light energy to the cationic photopolymerization initiator can be used without a particular limitation. For example, a thioxanthone or an anthracene compound having an alkoxy group at the 9-position and the 10-position (9,10-dialkoxyanthracene derivative) is preferable. Examples of the alkoxy group include an alkoxy group having 1 to 4 carbon atom(s) such as a methoxy group, an ethoxy group, a propoxy group, or a butoxy group. The 9,10-dialkoxyanthracene derivative may further include a substituent. Examples of the substituent include a halogen atom such as a fluorine atom, a chlorine atom, a bromine atom, or an iodine atom, an alkyl group having 1 to 4 carbon atom(s) such as a methyl group, an ethyl group, or a propyl group, a sulfonic acid alkyl ester group, and a carboxylic acid alkyl ester group. Examples of the alkyl in the sulfonic acid alkyl ester group or the carboxylic acid alkyl ester group include an alkyl having 1 to 4 carbon atom(s) such as a methyl group, an ethyl group, or a propyl group. The substitution position of these substituents is preferably the 2-position.

Specific examples of the thioxanthone include 2,4-dimethylthioxanthone, 2,4-diethylthioxanthone, 2-chlorothioxanthone, 2,4-diisopropylthioxanthone and the like. Of these, 2,4-diethylthioxanthone (e.g., trade name KAYA-CURE DETX-S, manufactured by Nippon Kayaku Co., Ltd.) and 2,4-diisopropylthioxanthone are preferable.

Examples of the 9,10-dialkoxyanthracene derivative include 9,10-dimethoxyanthracene, 9,10-diethoxyanthracene, 9,10-dipropoxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid methyl ester, 9,10-diethoxyanthracene-2-sulfonic acid methyl ester, and 9,10-dimethoxyanthracene-2-carboxylic acid methyl ester. These sensitizers may be used singly or in a mixture of two or more.

The content of the sensitizer in the photosensitive resin composition of the present invention is not particularly limited as long as it is within a range in which the effect of the present invention is not impaired. The sensitizer is preferably used in an amount of 30% by mass or less, more preferably 20% by mass or less with respect to the cationic photopolymerization initiator (A).

As the ion catcher usable in combination with the photosensitive resin composition of the present invention, any ion catcher capable of reducing an adverse effect of an ion derived from the cationic photopolymerization initiator (A) can be used without a particular limitation. Examples thereof include an organoaluminum compound. Specific examples thereof include an alkoxyaluminum such as trismethoxyaluminum, trisethoxyaluminum, trisisopropoxyaluminum, isopropoxydiethoxyaluminum, or trisbutoxyaluminum, a phenoxyaluminum such as trisphenoxyaluminum or trisparamethylphenoxyaluminum, trisacetoxyaluminum, trisstearatoaluminum, trisbutylatoaluminum, trispropionatoaluminum, trisacetylacetonatoaluminum, tristrifluoroacetylacetonatoaluminum, trisethylacetoacetatoaluminum, diacetylacetonatodipivaloylmethanatoaluminum, and diisopropoxy(ethylacetoacetato)aluminum. These ion catchers may be used singly or in a mixture of two or more.

Further, an onium weak acid salt compound that generates a weak acid by irradiation with an ultraviolet ray can also be preferably used in combination as the ion catcher. Specific examples of an anion moiety of the onium salt include an alkyl sulfonic acid such as methanesulfonic acid, ethanesulfonic acid, propanesulfonic acid, butanesulfonic acid, or camphorsulfonic acid, and a weak acid structure such as trifluoromethanesulfonic acid, pentafluoroethanesulfonic acid, p-toluenesulfonic acid, benzenesulfonic acid, cyclohexanesulfonic acid, adamantanesulfonic acid, or dicyclopentadienesulfonic acid. These may be used singly or in a combination of two or more. A cation moiety of the onium salt is not particularly limited as long as it is a monovalent organic positive ion. However, an oxonium ion, an ammonium ion, a phosphonium ion, a sulfonium ion, or an iodonium ion is preferable. An ammonium ion, a phosphonium ion, a sulfonium ion, or an iodonium ion is more preferable, and a sulfonium ion or an iodonium ion is still more preferable. The onium weak acid salt compound may be used in combination to such an extent that the photopolymerization is not significantly inhibited.

The content of the ion catchers in the photosensitive resin composition of the present invention is not particularly limited as long as it is within a range in which the effect of the present invention is not impaired. In the case of the organoaluminum compound, it is preferably used in an amount of 10% by mass or less of the solid content of the photosensitive resin composition excluding the solvent.

The onium weak acid salt compound is preferably used in an amount of from 0.001 to 2% by mass with respect to the blending amount of the cationic photopolymerization initiator (A) of the present invention.

Various additives such as a thermoplastic resin, a colorant, a thickener, a defoaming agent, and a leveling agent can be used as needed in the photosensitive resin composition of the present invention. Examples of the thermoplastic resin include polyether sulfone, polystyrene, and polycarbonate. Examples of the colorant include phthalocyanine blue, phthalocyanine green, iodine green, crystal violet, titanium oxide, carbon black, and naphthalene black. Examples of the thickener include orben, benton, and montmorillonite. Examples of the defoaming agent include a silicone-based defoaming agent, a fluorine-based defoaming agent, and a polymer-based defoaming agent.

The content of these various additives in the photosensitive resin composition of the present invention is not particularly limited as long as it is within a range in which the effect of the present invention is not impaired. These various additives are preferably used in an amount of 30% by mass or less of the solid content of the photosensitive resin composition excluding the solvent.

An inorganic filler such as, for example, barium sulfate, barium titanate, silicon oxide, amorphous silica, talc, clay, magnesium carbonate, calcium carbonate, aluminum oxide, aluminum hydroxide, or mica powder can be further used as needed in the photosensitive resin composition of the present invention.

The content of these inorganic fillers in the photosensitive resin composition of the present invention is not particularly limited as long as it is within a range in which the effect of the present invention is not impaired. These inorganic fillers are preferably used in an amount of 60% by mass or less of the solid content of the photosensitive resin composition excluding the solvent.

The photosensitive resin composition of the present invention can be obtained by blending the cationic photopolymerization initiator (A) and the epoxy compound (B) as the essential components, and then adding the optional component(s) as needed thereto, followed by mixing and stirring by a known method. Alternatively, dispersion and mixing may be performed as needed using a dispersion machine such as a dissolver, a homogenizer, or a triple roll mill. Further, filtration may be performed using a mesh, a membrane filter, or the like after mixing.

The photosensitive resin composition of the present invention is preferably used in a liquid form.

In a case where the photosensitive resin composition of the present invention is used for forming a cured product on a substrate, for example, a photosensitive resin composition layer can be formed by applying the photosensitive resin composition on a silicon substrate, a substrate with a metal film or a metal oxide film of aluminum, copper, platinum, gold, titanium, chromium, tantalum, or the like, a ceramic substrate of lithium tantalite, glass, silicon oxide, silicon nitride, or the like, or a substrate of polyimide, polyethylene terephthalate, or the like in a thickness of from 0.1 to 1000 μm using a spin coater or the like, followed by a heat treatment at 60 to 130° C. for about 5 to 60 minutes to remove the solvent. Next, a mask having a predetermined pattern is placed on the layer, and the masked layer is irradiated with an ultraviolet ray and then subjected to a heat treatment at 50 to 130° C. for about 1 to 50 minutes. After that, an unexposed part is developed using a developer at room temperature (e.g., 15° C. or higher) to 50° C. for about 1 to 180 minutes to form a pattern. Subsequently, the developed layer is subjected to a heat treatment at 130 to 200° C. to obtain a cured product having desired properties.

Examples of the developer which can be used include an organic solvent such as γ-butyrolactone, triethylene glycol dimethyl ether, or propylene glycol monomethyl ether acetate, or a mixed liquid of the above organic solvent and water. For developing, a developing device such as a paddle developing device, a splay developing device, or a shower developing device may be used. Ultrasound irradiation may be performed as needed. Note that, as a preferable metal substrate used for the photosensitive resin composition of the present invention, aluminum can be mentioned.

Various conditions for forming a cured product using the photosensitive resin composition of the present invention are not limited to the ones described above and can be appropriately controlled as needed.

The photosensitive resin composition of the present invention can be used to produce a dry film resist by applying the composition on a base film using a roll coater, a die coater, a knife coater, a bar coater, a gravure coater or the like, then drying the applied composition in a drying furnace set at from 45 to 100° C. to remove a predetermined amount of the solvent, and, if necessary, laminating thereon a cover film or the like. In this process, the thickness of the resist on the base film is controlled to from 2 to 200 μm. As the base film and the cover film, for example, a film of polyester, polypropylene, polyethylene, TAC, polyimide, or the like can be used. For those films, a film subjected to a release treatment using a silicone-based releasing agent, a non-silicone-based releasing agent, or the like as needed may be used. When this dry film resist is used, for example, the cover film is peeled off and the dry film resist is transferred to a substrate at a temperature of 40 to 100° C. at a pressure of 0.05 to 2 MPa by a hand roller, a laminator, or the like and then subjected to the exposure, the post-exposure baking, the development, and the heat treatment in the same manner as in the formation of the cured product described above.

Various conditions for forming and using a dry film resist using the photosensitive resin composition of the present invention are not limited to the ones described above and can be appropriately controlled as needed.

When the photosensitive resin composition is supplied as the dry film resist as described above, the application step on a support and the drying step can be omitted, making it possible to more simply perform a pattern formation using the photosensitive resin composition of the present invention.

When employed as a MEMS package or a semiconductor package, the photosensitive resin composition of the present invention can be used for producing a covering or a hollow structure. As a substrate for the MEMS or semiconductor package, for example, a substrate, which is obtained by forming a metal thin film of aluminum, copper, platinum, gold, titanium, chromium, tantalum, or the like on a silicon wafer of various shapes in a film thickness of from 10 to 5000 Å by a sputtering, deposition, or CVD method, followed by fine processing of the metal by an etching method or the like, is used. In some cases, a film of silicon oxide or silicon nitride may be further formed in a film thickness of from 10 to 10000 Å as an inorganic protecting film. Next, a MEMS or semiconductor device is produced or disposed on the substrate. In order to shield the device from the outside air, a covering or hollow structure needs to be produced. In a case where the device is covered with the photosensitive resin composition of the present invention, the covering can be performed by the above method. Further, in a case where the hollow structure is produced, a partition wall is formed on the substrate by the above method, and the patterning is further performed thereon by the above method such that the dry film serves as a lid on the laminate and the partition wall. In this manner, a hollow package structure can be produced. Further, after production, if necessary, the hollow package structure is subjected to a heat treatment at 130 to 200° C. for 10 to 120 minutes, so that a MEMS package component and a semiconductor package component having desired properties can be obtained.

Note that the term "package" herein means a sealing method used for shielding the intrusion of gas or liquid from the outside in order to maintain stability of a substrate, a wiring, an element, and the like. The package referred to herein represents, for example, a hollow package for packaging a device having a driving unit such as the MEMS and a vibrator such as a SAW device, surface protection in order to prevent deterioration of a semiconductor substrate, a printed wiring board, a wiring, and the like, and resin sealing.

A photosensitive resin composition of the present invention is used for producing a micro electro-mechanical system (MEMS) component, a micromachine component, a microfluidic component, a micro total analysis system (μ-TAS) component, an inkjet printing head component, a microreactor component, an insulating layer of an electronic component such as a capacitor or an inductor, a LIGA component, a die and a stamp for micro injection molding and heat embossing, a screen or a stencil for a fine printing application, a package component of a MEMS sensor, a semiconductor device, a frequency filter device, or the like installed in a portable terminal or an IoT component, a bio-MEMS and a bio-photonic device, and a printed wiring board, and the like. Among them, the photosensitive resin composition is useful for a MEMS package component and a semiconductor package component, a microfluidic component, and an inkjet printing head component.

EXAMPLES

Hereinafter, the present invention will be described in more detail by way of Examples. These Examples are merely exemplary for the purpose of suitably illustrating the present invention and not intended to limit the present invention by any means.

Examples 1 to 16 and Comparative Examples 1 to 12

(Preparation of Photosensitive Resin Composition Liquid)

A solvent was added to a resin composition described in Tables 1 to 3 (unit: part by mass, indicating only mass of solid content excluding solvent) in an amount by which the viscosity reached from 1 to 10 Pa·s. The blend was stirred and mixed in a flask with a stirrer under conditions of 80° C. for 3 hours to dissolve the resin composition. After cooling, filtration was performed using a membrane filter having a pore diameter of 5 μm, thereby obtaining a photosensitive resin composition liquid of the present invention or for comparison.

(Evaluation of Sensitivity and Resolution of Photosensitive Resin Composition)

Each photosensitive resin composition liquid obtained in Examples 1 to 16 and Comparative examples 1 to 12 was applied on a silicon wafer using a spin coater, and then prebaking was performed for 15 minutes using a hot plate at 95° C., thereby obtaining a photosensitive resin composition layer having a smooth surface. Then, the layer was cleared of edge beads and dried, and then irradiated with an ultraviolet ray through a photomask with a gray scale for evaluation of resolution by using an i-line exposure apparatus (mask aligner: manufactured by USHIO Inc.). Subsequently, the post exposure baking was performed using a hot plate at 95° C. for 5 minutes. Next, the baked layer was immersed and developed in SU-8 Developer (trade name, manufactured by MicroChem Corp., having propylene glycol monomethyl ether acetate as major component) at 23° C. for 3 minutes, rinsed with 2-propanol, and dried to obtain a cured resin pattern on the silicon wafer. The exposure dose that attained the best precision during mask transfer was defined as an optimum exposure dose, and the sensitivity and the resolution were evaluated. The results are shown in the following Table 1. Note that the term "film thickness" in Table 1 refers to a film thickness of the cured resin pattern.

(Production of Film-Shaped Cured Product of Photosensitive Resin Composition)

A film-shaped cured product was produced by the following steps using the photosensitive resin composition liquid of the present invention or for comparison obtained in Examples 1 to 16 and Comparative examples 1 to 12.

1) The photosensitive resin composition liquid is applied on a PET film using a Baker type applicator.

2) The applied liquid is dried on a hot plate under conditions of 50° C. for 3 minutes and then 95° C. for 30 minutes to obtain a coating film having a film thickness of about 100 μm.

3) The coating film is irradiated with an ultraviolet ray in an exposure dose described in Tables 1 to 3 using an i-line exposure apparatus (mask aligner: manufactured by USHIO Inc.).

4) The coating film is heated for facilitating polymerization on a hot plate under conditions of 95° C. for 10 minutes.

5) The resin composition film is peeled off from the PET film and subjected to cure fully in an oven at 200° C. for 60 minutes.

(Evaluation of PCT Extraction Water of Film-Shaped Cured Product of Photosensitive Resin Composition)

The film-shaped cured product obtained in the above manner was cut into a piece accurately weighing about 3 grams, and the cut piece was then placed in a PCT container made of Teflon (registered trademark). Ion exchange distilled water in an amount of 50 g was accurately weighed and added in the PCT container. After the PCT container was tightly sealed in a pressure vessel made of SUS and allowed to stand under conditions of 121° C. and 2 atm for 24 hours, the PCT container was allowed to cool down to room temperature. Then, the extraction water was taken out and measured for a conductivity and a hydrogen ion concentration index, followed by evaluation according to the following criteria. The results are shown in Tables 1 to 3.

Evaluation criteria for conductivity of extraction water

Less than 120 μS/cm; "○"

Equal to or greater than 120 μS/cm and less than 1200 μS/cm; "x"

Equal to or greater than 1200 μS/cm; "x x"

Hydrogen ion concentration index ratio

Hydrogen ion index ratio, with respect to pure water as blank test water, of equal to or greater than 0.7; "○", less than 0.7; "x"

TABLE 1

Formulations and evaluation results of photosensitive resin compositions

| | | Examples | | | | | | | |
|---|---|---|---|---|---|---|---|---|---|
| | | 1 | 2 | 3 | 4 | 5 | 6 | 7 | 8 |
| Cationic photopolymerization initiator (A) | (A-1) | 1 | 2 | 1 | 1.5 | 3 | 3 | 1.5 | 1 |
| | (A-2) | | | | | | | | |
| | (A-3) | | | | | | | | |
| | (A-4) | | | | | | | | |
| | (A-5) | | | | | | | | |
| | (A-6) | | | | | | | | |
| | (A-7) | | | | | | | | |
| | (A-8) | | | | | | | | |
| | (A-9) | | | | | | | | |
| Epoxy compound (B) | (B-1) | 53.5 | | | 80 | | | 100 | |
| | (B-2) | 15 | 11.98 | | 20 | 15 | 22.25 | | |
| | (B-3) | 25 | | | | | | | |
| | (B-4) | | 35.39 | 100 | | 80 | 67.25 | | |
| | (B-5) | | | | | | | | 100 |
| | (B-6) | | | | | | | | |
| | (B-7) | | | | | | | | |
| | (B-8) | | | | | | | | |
| | (B-10) | | | | | | | | |
| | (B-11) | | 42.63 | | | | | | |
| | (B-13) | | | | | | | | |
| | (B-14) | 5 | | | 4 | | | | |
| | (B-15) | | | | | 4 | | | |
| | (B-16) | | | | | | | | |
| Polyphenol resin | (PF-1) | | 10 | | 20 | | | | |
| | (PF-2) | | | | | | 10 | | |
| Polyol resin | (PO-1) | | | | | 5 | | | |
| Coupling agent | (SC-1) | 1.5 | 5 | 2 | 2 | 5 | 5 | | |
| Solvent | | CP | DG | CP | CP | PGMA | PGMA | CP | CP |
| Film thickness [μm] | | 25 | 25 | 80 | 50 | 25 | 25 | 25 | 25 |
| Optimum exposure dose [mJ/cm$^2$] | | 250 | 250 | 350 | 250 | 150 | 150 | 200 | 180 |
| Exposure dose for forming film cured product [mJ/cm$^2$] | | 500 | 500 | 500 | 500 | 500 | 500 | 500 | 500 |
| Conductivity of PCT extraction water [μS/cm] | | ○ | ○ | ○ | ○ | ○ | ○ | ○ | ○ |
| Hydrogen ion concentration index ratio of PCT extraction water | | ○ | ○ | ○ | ○ | ○ | ○ | ○ | ○ |

※CP: Cyclopentanone
PGMA: Propyleneglycol monomethylether acetate
DG: Diglyme

TABLE 2

Formulations and evaluation results of photosensitive resin compositions

| | | Examples | | | | | | | |
|---|---|---|---|---|---|---|---|---|---|
| | | 9 | 10 | 11 | 12 | 13 | 14 | 15 | 16 |
| Cationic photopolymerization initiator (A) | (A-1) | 1.5 | 1.5 | 1.5 | 2 | 2 | 1.5 | 2 | 1 |
| | (A-2) | | | | | | | | |
| | (A-3) | | | | | | | | |
| | (A-4) | | | | | | | | |
| | (A-5) | | | | | | | | |
| | (A-6) | | | | | | | | |
| | (A-7) | | | | | | | | |
| | (A-8) | | | | | | | | |
| | (A-9) | | | | | | | | |
| Epoxy compound (B) | (B-1) | | | | | | | | |
| | (B-2) | | | | | | | | |
| | (B-3) | | | | | | | | |
| | (B-4) | | | | | | | | |
| | (B-5) | | | | | | | | |
| | (B-6) | 100 | | | | | | | |
| | (B-7) | | 100 | | | | | | |
| | (B-8) | | | 100 | | | | | |
| | (B-9) | | | | 100 | | | | |
| | (B-10) | | | | | 100 | | | |
| | (B-11) | | | | | | 100 | | |
| | (B-12) | | | | | | | 100 | |
| | (B-13) | | | | | | | | 100 |

TABLE 2-continued

Formulations and evaluation results of photosensitive resin compositions

|  |  | Examples |  |  |  |  |  |  |  |
|---|---|---|---|---|---|---|---|---|---|
|  |  | 9 | 10 | 11 | 12 | 13 | 14 | 15 | 16 |
|  | (B-14) |  |  |  |  |  |  |  |  |
|  | (B-15) |  |  |  |  |  |  |  |  |
|  | (B-16) |  |  |  |  |  |  |  |  |
| Polyphenol resin | (PF-1) |  |  |  |  |  |  |  |  |
|  | (PF-2) |  |  |  |  |  |  |  |  |
| Polyol resin | (PO-1) |  |  |  |  |  |  |  |  |
| Coupling agent | (SC-1) |  |  |  |  |  |  | 5 |  |
| Solvent |  | CP | CP | CP | CP | CP | CP | CP | None |
| Film thickness [μm] |  | 25 | 25 | 25 | 20 | 20 | 50 | 80 | 100 |
| Optimum exposure dose [mJ/cm²] |  | 350 | 350 | 350 | 600 | 600 | 250 | 200 | 250 |
| Exposure dose for forming film cured product [mJ/cm²] |  | 500 | 500 | 500 | 1000 | 1000 | 500 | 400 | 500 |
| Conductivity of PCT extraction water [μS/cm] |  | ○ | ○ | ○ | ○ | ○ | ○ | ○ | ○ |
| Hydrogen ion concentration index ratio of PCT extraction water |  | ○ | ○ | ○ | ○ | ○ | ○ | ○ | ○ |

※CP: Cyclopentanone

TABLE 3

Formulations and evaluation results of photosensitive resin compositions

|  |  | Comparative Examples |  |  |  |  |  |  |  |  |  |  |  |
|---|---|---|---|---|---|---|---|---|---|---|---|---|---|
|  |  | 1 | 2 | 3 | 4 | 5 | 6 | 7 | 8 | 9 | 10 | 11 | 12 |
| Cationic photopolymerization initiator (A) | (A-1) |  |  |  |  |  |  |  |  | 2 |  |  |  |
|  | (A-2) |  | 1 |  |  |  |  |  |  |  |  | 1.5 | 2 |
|  | (A-3) |  |  | 0.4 |  |  | 1.5 |  |  |  |  |  |  |
|  | (A-4) |  |  |  | 1 |  |  |  |  |  |  |  |  |
|  | (A-5) |  |  |  |  | 3 |  |  |  |  |  |  |  |
|  | (A-6) |  |  |  |  |  |  |  | 4.6 | 3.8 |  |  |  |
|  | (A-7) | 4 |  |  |  |  |  |  |  |  |  |  |  |
|  | (A-8) |  |  |  |  |  |  |  |  |  | 2 |  |  |
|  | (A-9) |  |  |  |  |  | 0.1 |  |  |  |  |  |  |
| Epoxy compound (B) | (B-1) | 53.5 | 53.5 | 53.5 | 53.5 | 53.5 | 2 |  | 80 |  |  |  |  |
|  | (B-2) | 15 | 15 | 15 | 15 | 15 |  |  | 20 |  |  |  | 11.98 |
|  | (B-3) | 25 | 25 | 25 | 25 | 25 |  |  |  |  |  |  |  |
|  | (B-4) |  |  |  |  |  |  | 100 |  |  |  |  | 35.39 |
|  | (B-5) |  |  |  |  |  |  |  |  |  |  |  |  |
|  | (B-6) |  |  |  |  |  |  |  |  |  |  |  |  |
|  | (B-7) |  |  |  |  |  |  |  |  |  |  |  |  |
|  | (B-8) |  |  |  |  |  |  |  |  |  |  |  |  |
|  | (B-9) |  |  |  |  |  |  |  |  |  |  |  |  |
|  | (B-10) |  |  |  |  |  |  |  |  |  |  |  |  |
|  | (B-11) |  |  |  |  |  |  |  |  |  |  | 100 | 42.63 |
|  | (B-12) |  |  |  |  |  |  |  |  |  | 100 |  |  |
|  | (B-13) |  |  |  |  |  |  |  |  |  |  |  |  |
|  | (B-14) | 5 | 5 | 5 | 5 | 5 |  | 4 | 4 |  |  |  |  |
|  | (B-15) |  |  |  |  |  |  |  |  |  |  |  |  |
|  | (B-16) |  |  |  |  |  |  |  |  | 100 |  |  |  |
| Polyphenol resin | (PF-1) |  |  |  |  |  |  |  | 20 |  |  |  | 10 |
|  | (PF-2) |  |  |  |  |  |  |  |  |  |  |  |  |
| Polyol resin | (PO-1) |  |  |  |  |  |  |  |  |  |  |  |  |
| Coupling Agent | (SC-1) | 1.5 | 1.5 | 1.5 | 1.5 | 1.5 | 5 | 2 | 2 | None | 5 |  | 5 |
| Solvent |  | CP | CP | CP | CP | CP | MEK | PGMA | CP | None | CP | DG | DG |
| Film thickness [μm] |  | 25 | 25 | 25 | 25 | 60 | 25 | 80 | 80 | 100 | 80 | 50 | 50 |
| Optimum exposure dose [mJ/cm²] |  | 250 | 250 | 250 | 180 | 200 | 250 | 350 | 250 | 500 | 200 | 250 | 250 |
| Exposure dose for forming film cured product [mJ/cm²] |  | 500 | 500 | 500 | 500 | 500 | 500 | 500 | 500 | 500 | 400 | 500 | 500 |
| Conductivity of PCT extraction water [μS/cm] |  | XX | X | X | X | X | X | X | X | X | XX | X | X |
| Hydrogen ion concentration index ratio of PCT extraction water |  | X | X | X | X | X | X | X | X | X | X | X | X |

※CP: Cyclopentanone
MEK: Methyl ethyl ketone
PGMA: Propyleneglycol monomethylether acetate
DG: Diglyme Note that (A-1) to (SC-1) in Tables 1 to 3 each represents the following substance.

(A-1): trade name CPI-310FG (salt composed of anion represented by formula (1) and cation, triaryl sulfonium-tetrakis pentafluorophenyl gallate, manufactured by San-Apro Ltd.)

(A-2): trade name CPI-310B (cationic photopolymerization initiator for comparison, triarylsulfonium-tetrakis pentafluorophenyl borate, manufactured by San-Apro Ltd.)

(A-3): trade name Irgacure 290 (cationic photopolymerization initiator for comparison, tris[4-(4-acetylphenyl) sulfonylphenyl]sulfoniumtetrakis(2,3,4,5,6-pentafluorophenyl)borate, manufactured by BASF SE)

(A-4): trade name TAG-382 (cationic photopolymerization initiator for comparison, aryl sulfonium-tetrakis pentafluoroborate, manufactured by TOYO INK Co., Ltd.)

(A-5): trade name GSID-26-1 (cationic photopolymerization initiator for comparison, tris[4-(4-acetylphenyl)sulfonylphenyl]sulfoniumtris[(trifluoromethyl)sulfonium]methane, manufactured by BASF SE)

(A-6): trade name CPI-210S (cationic photopolymerization initiator for comparison, 4-(phenylthio)phenyldiphenylsulfoniumtris(pentafluoroethyl)trifluorophosphate, manufactured by San-Apro Ltd.)

(A-7): trade name CPI-101A (cationic photopolymerization initiator for comparison, diphenyl[p-(phenylthio)phenyl]sulfoniumhexafluoroantimonate, manufactured by San-Apro Ltd.)

(A-8): trade name SP-172 (cationic photopolymerization initiator for comparison, aryl sulfonium-hexafluoroantimonate, manufactured by ADEKA Corp.)

(A-9): trade name CPI-310CS (cationic photopolymerization initiator for comparison, aryl sulfonium-camphorsulfonate, manufactured by San-Apro Ltd.)

(B-1): trade name KM-N LCL (epoxy compound (b-1) represented by formula (2), average repetition number k=4, $R_5$ is glycidyl, epoxy equivalent of 210 g/eq., manufactured by Nippon Kayaku Co., Ltd.)

(B-2): trade name NER-7604 (epoxy compound (b-2) represented by formula (3), average repetition number m=4, $R_6$ is hydrogen, $R_7$ is glycidyl, epoxy equivalent of 347 g/eq., manufactured by Nippon Kayaku Co., Ltd.)

(B-3): trade name NC-3000H (epoxy compound (b-3) represented by formula (4), average repetition number n=2, $R_5$ is hydrogen, epoxy equivalent of 285 g/eq., manufactured by Nippon Kayaku Co., Ltd.)

(B-4): trade name NC-6300H (epoxy compound (b-4), which is a mixture of compounds represented by formulae (5) to (7), $R_9$ and $R_{10}$ are hydrogen or glycidyl, epoxy equivalent of 225 g/eq., manufactured by Nippon Kayaku Co., Ltd.)

(B-5): trade name KHE-2033 (epoxy compound (b-5), which is a product of co-condensation reaction of compound represented by formula (8) and a mixture of compounds represented by formulae (10) and (11), epoxy equivalent of 495 g/eq., manufactured by Nippon Kayaku Co., Ltd.)

(B-6): trade name EOCN-1020-70 (epoxy compound (b-6) represented by formula (12), epoxy equivalent of 200 g/eq., manufactured by Nippon Kayaku Co., Ltd.)

(B-7): trade name EPPN-201 (epoxy compound (b-6) represented by formula (12), p is 4, $R_1$ g is methyl, epoxy equivalent of 190 g/eq., manufactured by Nippon Kayaku Co., Ltd.)

(B-8): trade name EPPN-502H (epoxy compound (b-7) represented by formula (13), q is 1, epoxy equivalent of 170 g/eq., manufactured by Nippon Kayaku Co., Ltd.)

(B-9): trade name XD-1000 (epoxy compound (b-8) represented by formula (14), r is 1, epoxy equivalent of 253 g/eq., manufactured by Nippon Kayaku Co., Ltd.)

(B-10): trade name NC-7700 (epoxy compound (b-9) represented by formula (15), s is 1, $R_{13}$ is hydrogen, epoxy equivalent of 230 g/eq., manufactured by Nippon Kayaku Co., Ltd.)

(B-11): trade name jER-1007 (epoxy compound (b-2) represented by formula (3), average repetition number m=13, $R_6$ is methyl, $R_7$ is hydrogen, epoxy equivalent of 2,000 g/eq., manufactured by Mitsubishi Chemical Corp.)

(B-12): trade name EHPE-3150 (epoxy compound (b-10) represented by formula (16), average repetition number t+u+v=36, epoxy equivalent of 180 g/eq., manufactured by Daicel Corp.)

(B-13): trade name YD-8125 (epoxy compound (b-2) represented by formula (3), average repetition number m=1, $R_6$ is methyl, $R_7$ is hydrogen, epoxy equivalent of 172 g/eq., manufactured by Nippon Steel & Sumikin Chemical Co., Ltd.)

(B-14): trade name ED-505 (epoxy compound, trimethylolpropane triglycidyl ether, epoxy equivalent of 130 g/eq., manufactured by ADEKA Corp.)

(B-15): trade name ED-506 (epoxy compound, polypropyleneglycol polyglycidyl ether, epoxy equivalent of 310 g/eq., manufactured by ADEKA Corp.)

(B-16): trade name CELLOXIDE 2021P (epoxy compound, 3',4'-epoxycyclohexylmethyl 3,4-epoxycyclohexane carboxylate, epoxy equivalent of 126 g/eq., manufactured by Daicel Corp.)

(PF-1): trade name PN-80 (phenolic novolac resin, manufactured by MEIWA PLASTIC INDUSTRIES, Ltd., hydroxyl equivalent of 104 g/eq.)

(PF-2): trade name PN-152 (phenolic novolac resin, manufactured by MEIWA PLASTIC INDUSTRIES, Ltd., hydroxyl equivalent of 105 g/eq.)

(PO-1): PLACCEL 308 (trade name, manufactured by Daicel Corp., trifunctional polyol resin, molecular weight of 850, OH equivalent of 195 mgKOH/g)

(SC-1): 3-glycidoxy propyltrimethoxysilane (Evaluation of Adhesive Force of Photosensitive Resin Composition after Humidity and Heat Test)

The photosensitive resin composition was used to produce a cuboid-shaped cured product pattern having a film thickness of 38±5 μm and a square shape with a side of 100 μm on a silicon wafer by photography. The adhesive strength of the cuboid-shaped cured product pattern was measured after it was immersed in pure water for wet-heat test heated to 80° C. for 24 hours. The results are shown in Table 4. The shear strength of the cuboid-shaped cured product pattern having a square shape with a side of 100 μm was measured using "PTR-1000" manufactured by RHESCA Co., Ltd. as a measuring instrument, and this shear strength was regarded as the adhesive strength.

TABLE 4

Evaluation results of adhesive force of photosensitive resin compositions after humidity and heat test

| | Composition No. | | | | | |
|---|---|---|---|---|---|---|
| | Ex. 1 | Ex. 2 | Comp. Ex. 3 | Comp. Ex. 5 | Comp. Ex. 7 | Comp. Ex. 12 |
| Adhesive force of photosensitive resin composition after humidity and heat test | 65 MPa< | 65 MPa< | <50 MPa | <50 MPa | <50 MPa | <50 MPa |

As shown in the results in Tables 1 to 3, the properties of the composition obtained in each Example enable the highly sensitive ultraviolet photolithography. Further, the PCT extraction water of the cured product has a liquid property on a neutral side and a low conductivity, thus, it is clear that the cured product having a low-elution property and a low-contaminating property can be obtained.

Further, the results in Table 4 clearly show that the adhesive strength to the substrate after the wet-heat test is strong.

INDUSTRIAL APPLICABILITY

The photosensitive resin composition of the present invention has excellent resolution, gives a cured product of the composition having an extremely low level of eluted contaminant under humid and heated conditions, and also exhibits excellent adhesion to a substrate after the humidity and heat test, therefore, it can be used in an application using an aqueous fluid and an application requiring high resistance to humidity and heat at the time of resin sealing. More specifically, the photosensitive resin composition of the present invention is useful in particular for producing an MEMS package component and semiconductor package component, a micromachine component, a microfluidic component, a micro total analysis system (μ-TAS) component, an inkjet printing head component, a microreactor component, an insulating layer of an electronic component such as a capacitor or an inductor, a LIGA component, a die and a stamp for micro injection molding and heat embossing, a screen or a stencil for a fine printing application, a package component of a MEMS sensor, a semiconductor device, a frequency filter device, or the like installed in a portable terminal or an IoT component, a bio-MEMS and a bio-photonic device, and a printed wiring board.

The invention claimed is:

1. A photosensitive resin composition comprising a cationic photopolymerization initiator (A) and an epoxy compound (B), wherein:
   the cationic photopolymerization initiator (A) comprises a salt composed of an anion represented by a following formula (1) and a cation,

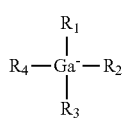

(1)

wherein $R_1$ to $R_4$ each independently denotes an alkyl group having 1 to 18 carbon atom(s) or an aryl group having 6 to 14 carbon atoms, and at least one of $R_1$ to $R_4$ denotes the aryl group having 6 to 14 carbon atoms; and
   the epoxy resin (B) includes an epoxy compound (b-2) represented by a following formula (3),

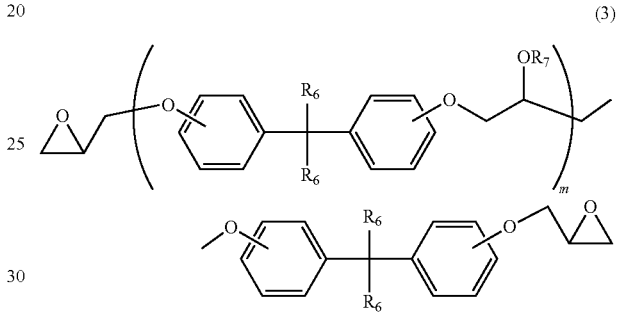

(3)

wherein $R_6$ each independently denotes an alkyl group having 2 to 4 carbon atom(s), or a trifluoromethyl group, $R_7$ denotes a hydrogen atom, and m is an average repetition number and denotes a real number in a range of from 1 to 30; and/or
   an epoxy compound (b-9) represented by a following formula (15),

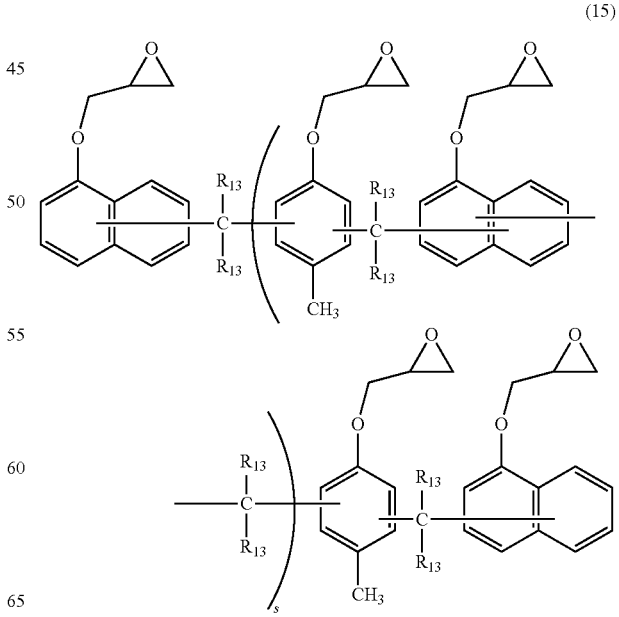

(15)

wherein $R_{13}$ each independently denotes a hydrogen atom or an alkyl group having 1 to 4 carbon atom(s), and s is an average repetition number and denotes a real number in a range of from 0 to 30; and the epoxy resin (B) optionally includes one or two or more kinds of epoxy compounds selected from a group consisting of:

an epoxy compound (b-3) represented by a following formula (4),

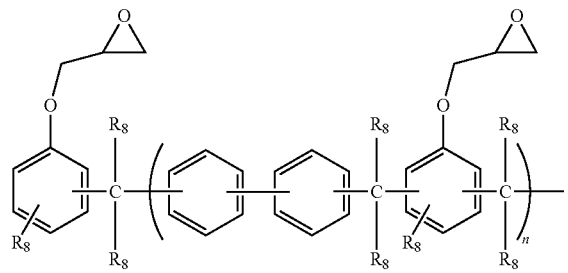

(4)

wherein $R_8$ each independently denotes a hydrogen atom or an alkyl group having 1 to 4 carbon atom(s), and n is an average repetition number and denotes a real number in a range of from 0 to 30;

one or more kinds of epoxy compounds (b-4) selected from a group consisting of epoxy compounds represented by following formulae (5) to (7),

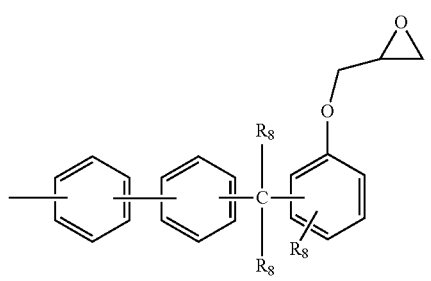

(5)

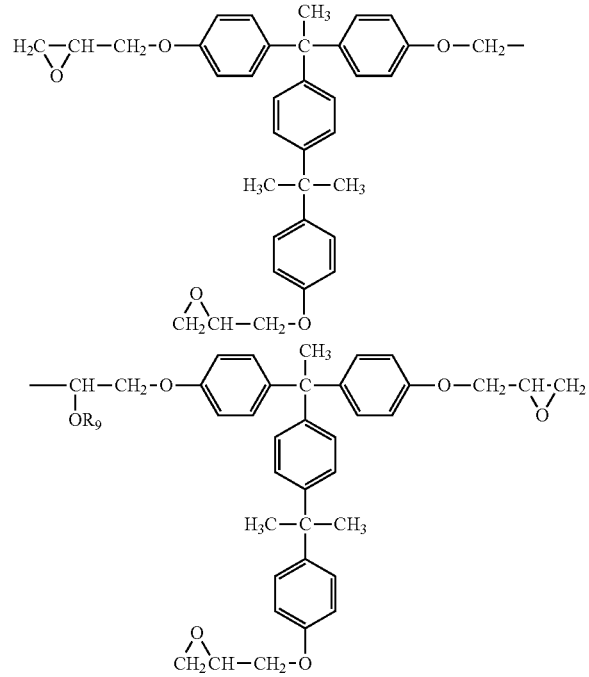

(6)

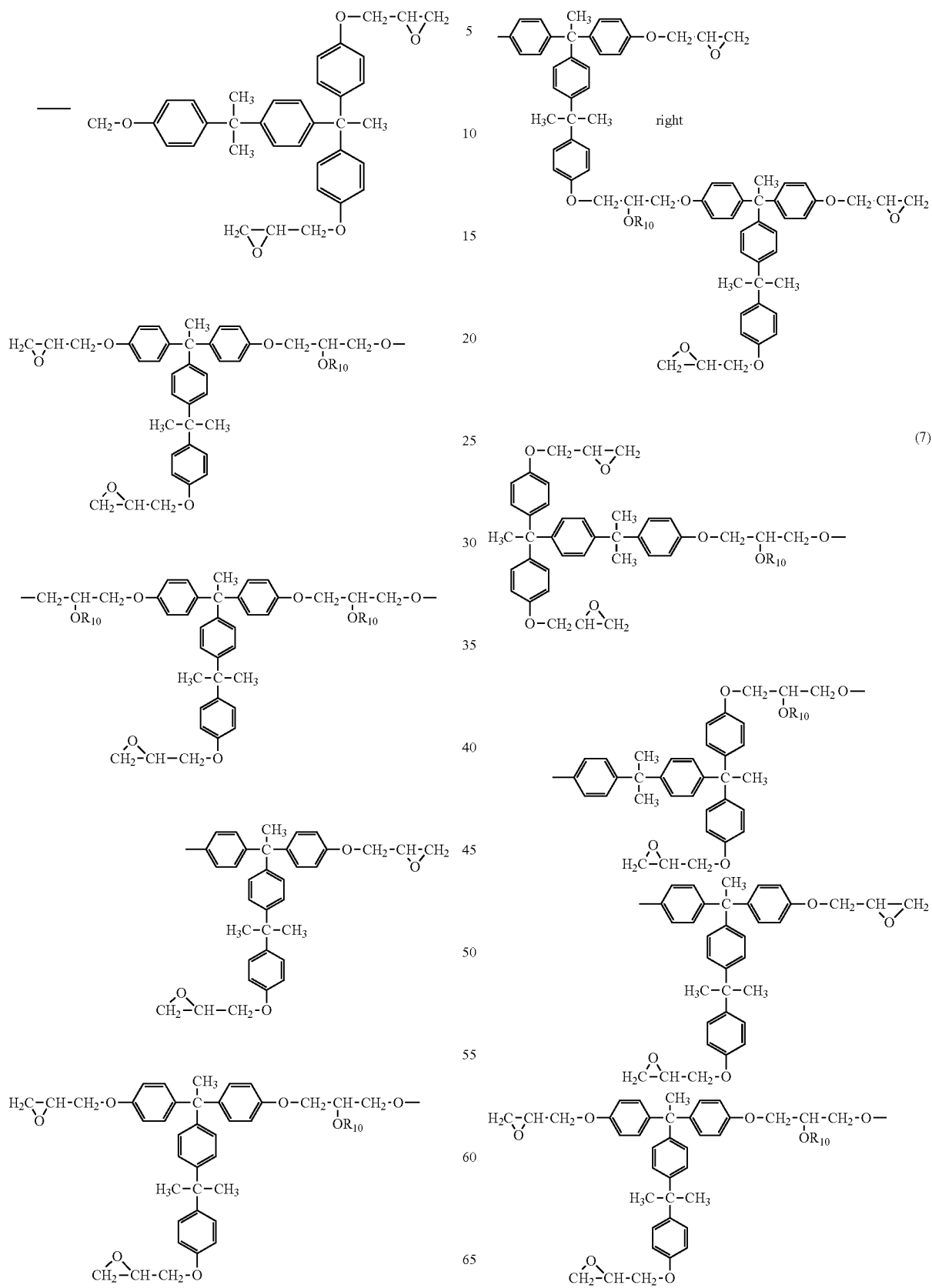

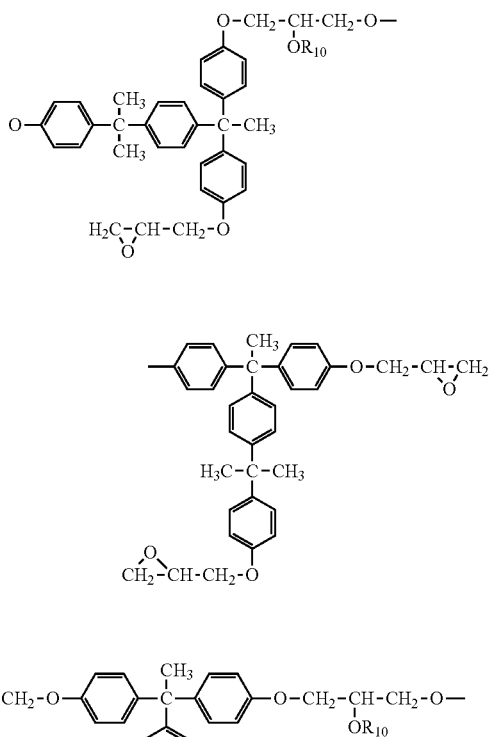
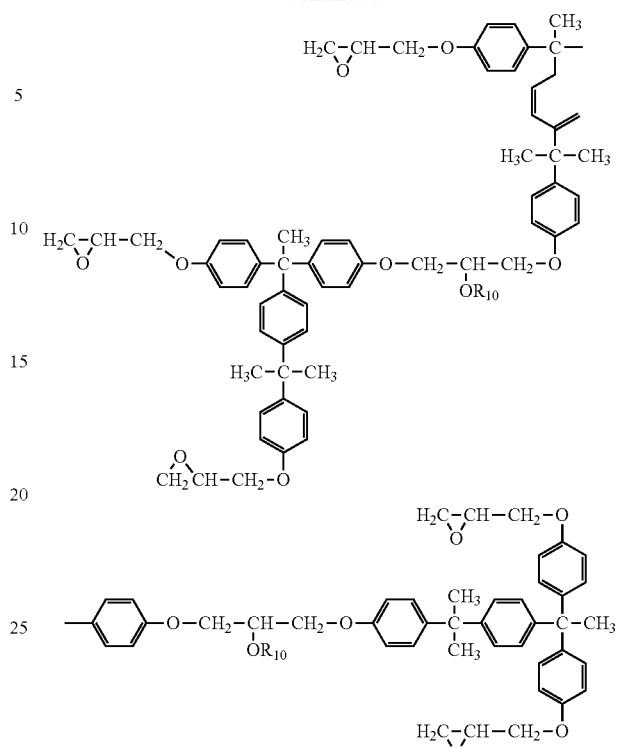
wherein, in the formula (6), $R_9$ each independently denotes a hydrogen atom or a glycidyl group, and, in the formula (7), $R_{10}$ each independently denotes a hydrogen atom or a glycidyl group;
an epoxy compound (b-5) that is a co-condensation product of a compound represented by following formula (8) and/or formula (9), and a compound represented by following formula (10) and/or formula (11);
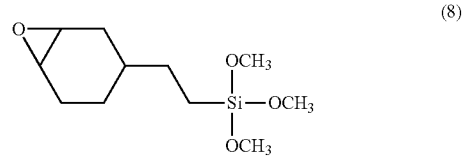 (8)
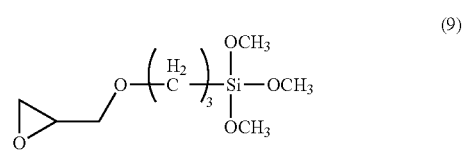 (9)
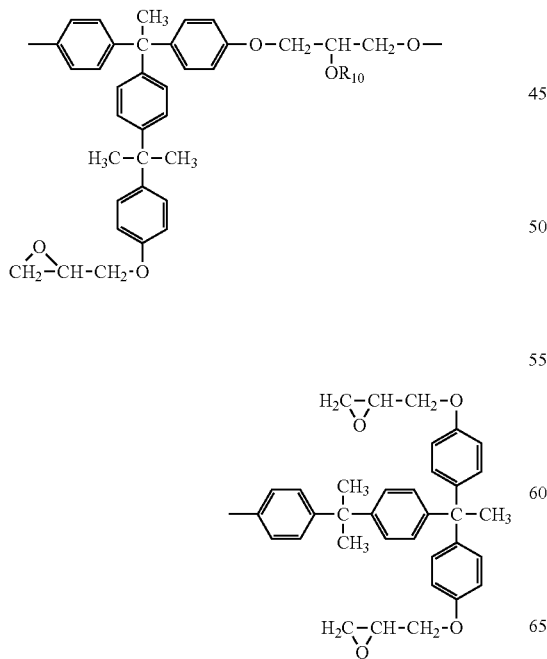
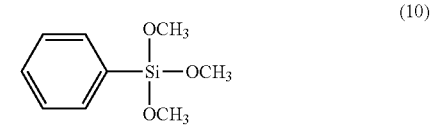 (10)
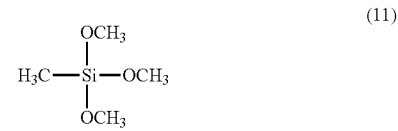 (11)

an epoxy compound (b-6) represented by a following formula (12)

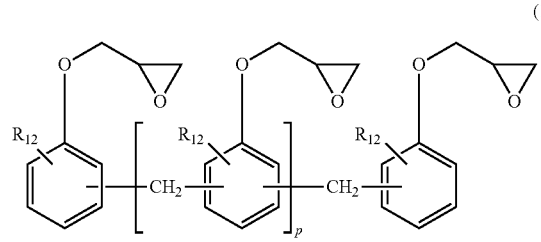

wherein $R_{12}$ each independently denotes an alkyl group having 2 to 4 carbon atom(s), and p is an average repetition number and denotes a real number in a range of from 0 to 10;

an epoxy compound (b-7) represented by a following formula (13),

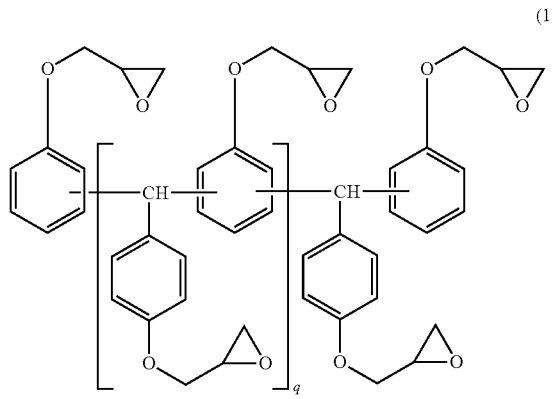

wherein q is an average repetition number and denotes a real number in a range of from 0 to 5;
and
an epoxy compound (b-10) represented by a following formula (16),

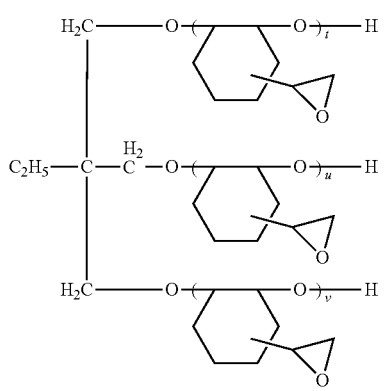

wherein t, u and v each is an average repetition number and denotes a real number satisfying a relation of $2 \leq t+u+v \leq 60$.

2. The photosensitive resin composition according to claim 1, wherein $R_1$ to $R_4$ each independently denotes a phenyl group having a perfluoroalkyl group as a substituent or a phenyl group having a fluorine atom as a substituent.

3. The photosensitive resin composition according to claim 2, wherein $R_1$ to $R_4$ each independently denotes a pentafluorophenyl group or a bis(trifluoromethyl)phenyl group.

4. The photosensitive resin composition according to claim 1, wherein the cationic photopolymerization initiator (A) comprises the salt composed of the anion represented by the formula (1) and the cation having an iodine atom or a sulfur atom.

5. A dry film resist comprising the photosensitive resin composition according to claim 1 between substrates.

6. A cured product of the photosensitive resin composition according to claim 1.

7. The photosensitive resin composition according to claim 2, wherein the cationic photopolymerization initiator (A) comprises the salt composed of the anion represented by the formula (1) and the cation having an iodine atom or a sulfur atom.

8. The photosensitive resin composition according to claim 3, wherein the cationic photopolymerization initiator (A) comprises the salt composed of the anion represented by the formula (1) and the cation having an iodine atom or a sulfur atom.

9. A dry film resist comprising the photosensitive resin composition according to claim 2 between substrates.

10. A dry film resist comprising the photosensitive resin composition according to claim 3 between substrates.

11. A dry film resist comprising the photosensitive resin composition according to claim 4 between substrates.

12. A dry film resist comprising the photosensitive resin composition according to claim 7 between substrates.

13. A dry film resist comprising the photosensitive resin composition according to claim 8 between substrates.

14. A cured product of the photosensitive resin composition according to claim 2.

15. A cured product of the photosensitive resin composition according to claim 3.

16. A cured product of the photosensitive resin composition according to claim 4.

17. A cured product of the photosensitive resin composition according to claim 7.

18. A cured product of the photosensitive resin composition according to claim 8.

19. A cured product of the dry film resist according to claim 5.

20. A cured product of the dry film resist according to claim 9.

21. A cured product of the dry film resist according to claim 10.

22. A cured product of the dry film resist according to claim 11.

23. A cured product of the dry film resist according to claim 12.

24. A cured product of the dry film resist according to claim 13.

25. A photosensitive resin composition comprising a cationic photopolymerization initiator (A) and an epoxy compound (B), wherein:
the cationic photopolymerization initiator (A) comprises a salt composed of an anion represented by a following formula (1) and a cation,

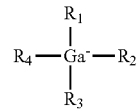

wherein $R_1$ to $R_4$ each independently denotes an alkyl group having 1 to 18 carbon atom(s) or an aryl group having 6 to 14 carbon atoms, and at least one of $R_1$ to $R_4$ denotes the aryl group having 6 to 14 carbon atoms; and the epoxy resin (B) includes an epoxy compound (b-9) represented by a following formula (15),

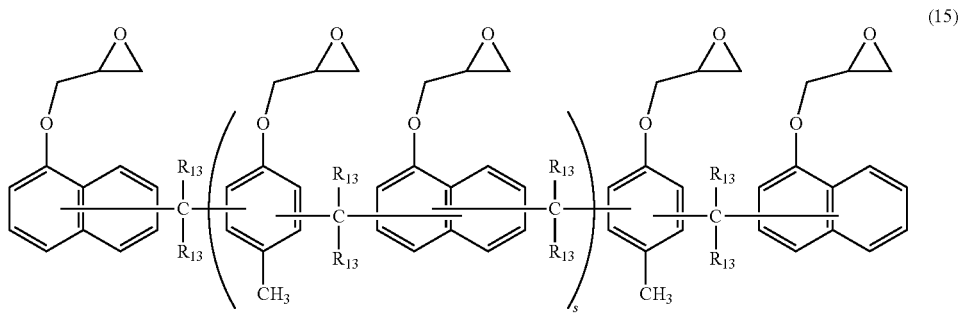

(15)

wherein $R_{13}$ each independently denotes a hydrogen atom or an alkyl group having 1 to 4 carbon atom(s), and s is an average repetition number and denotes a real number in a range of from 0 to 30; and the epoxy resin (B) optionally includes one or two or more kinds of epoxy compounds selected from a group consisting of:

an epoxy compound (b-3) represented by a following formula (4),

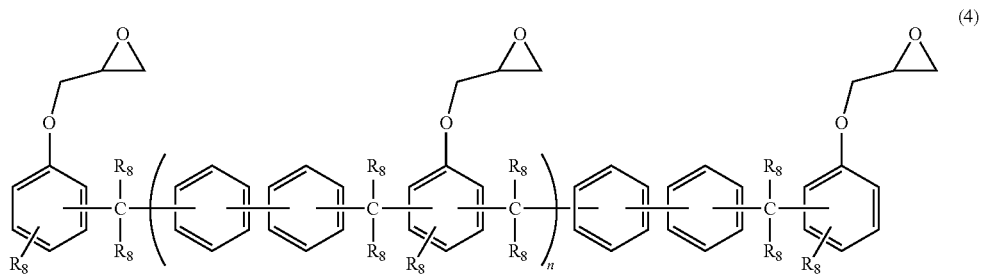

(4)

wherein $R_8$ each independently denotes a hydrogen atom or an alkyl group having 1 to 4 carbon atom(s), and n is an average repetition number and denotes a real number in a range of from 0 to 30;

one or more kinds of epoxy compounds (b-4) selected from a group consisting of epoxy compounds represented by following formulae (5) to (7),

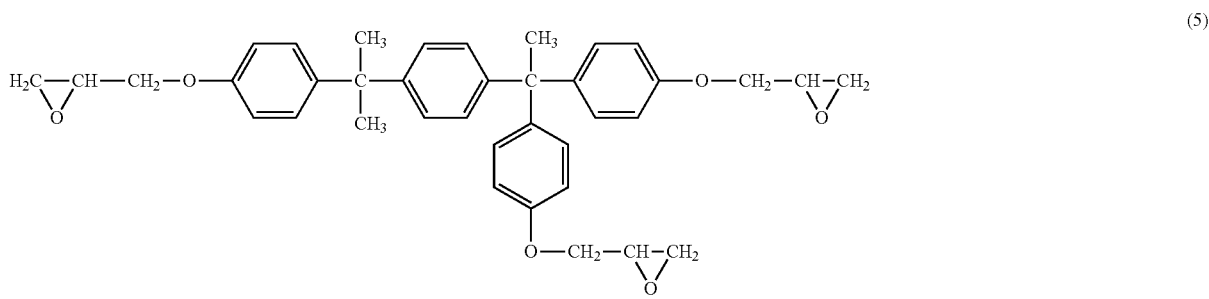

(5)

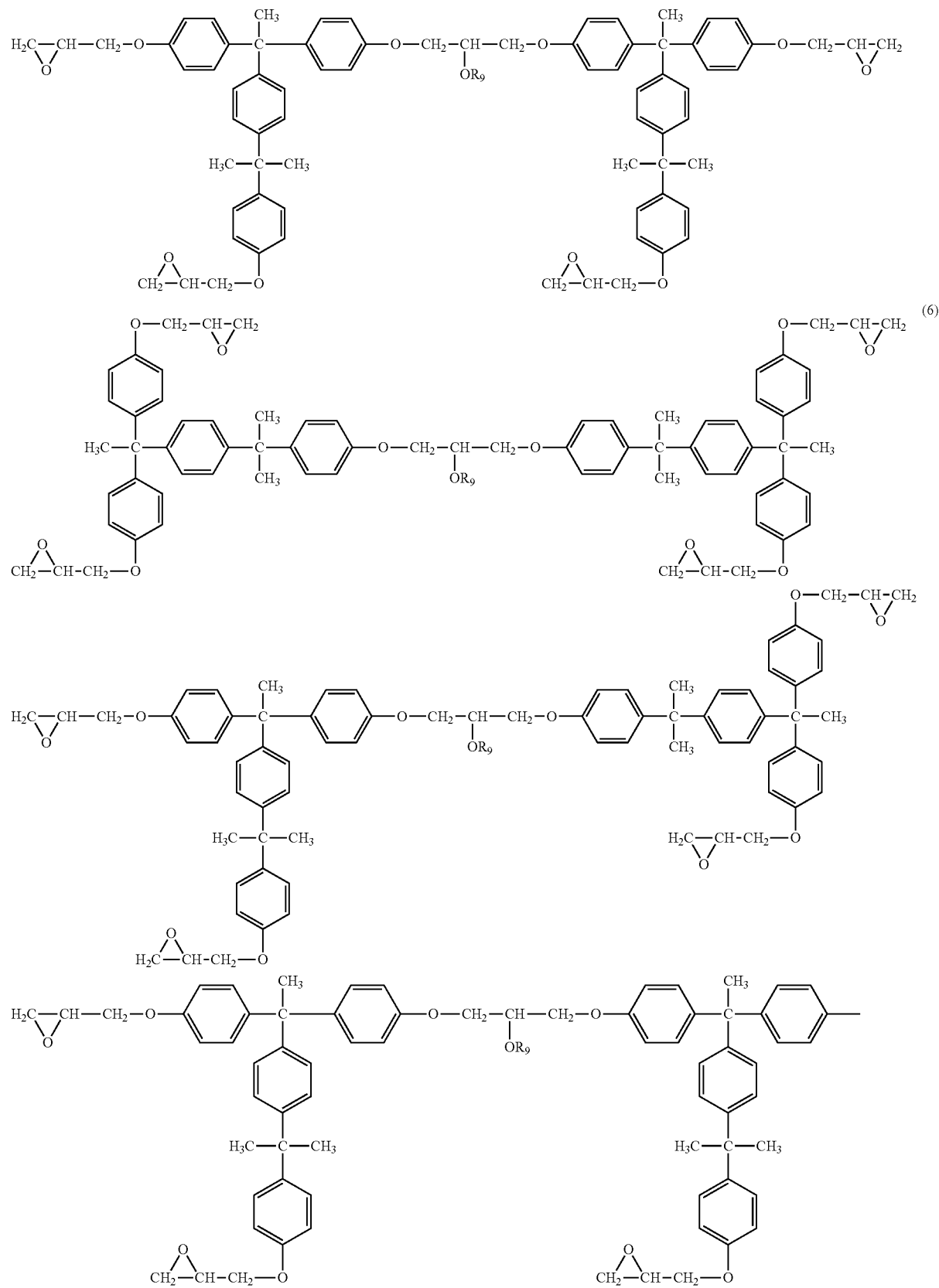
(6)

-continued
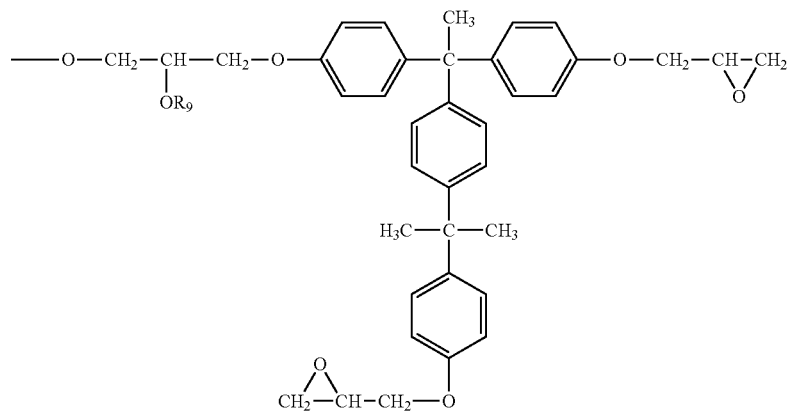
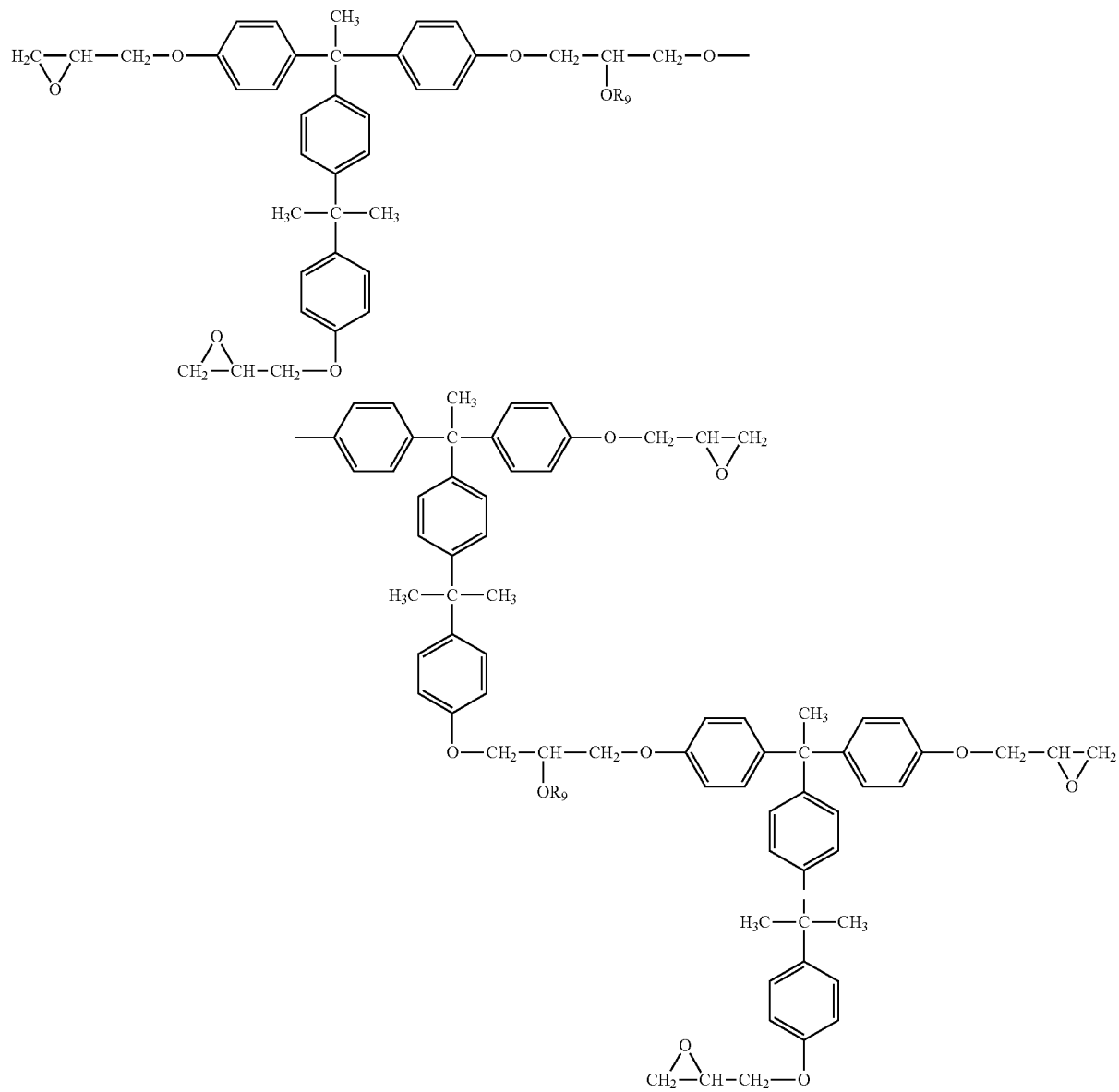

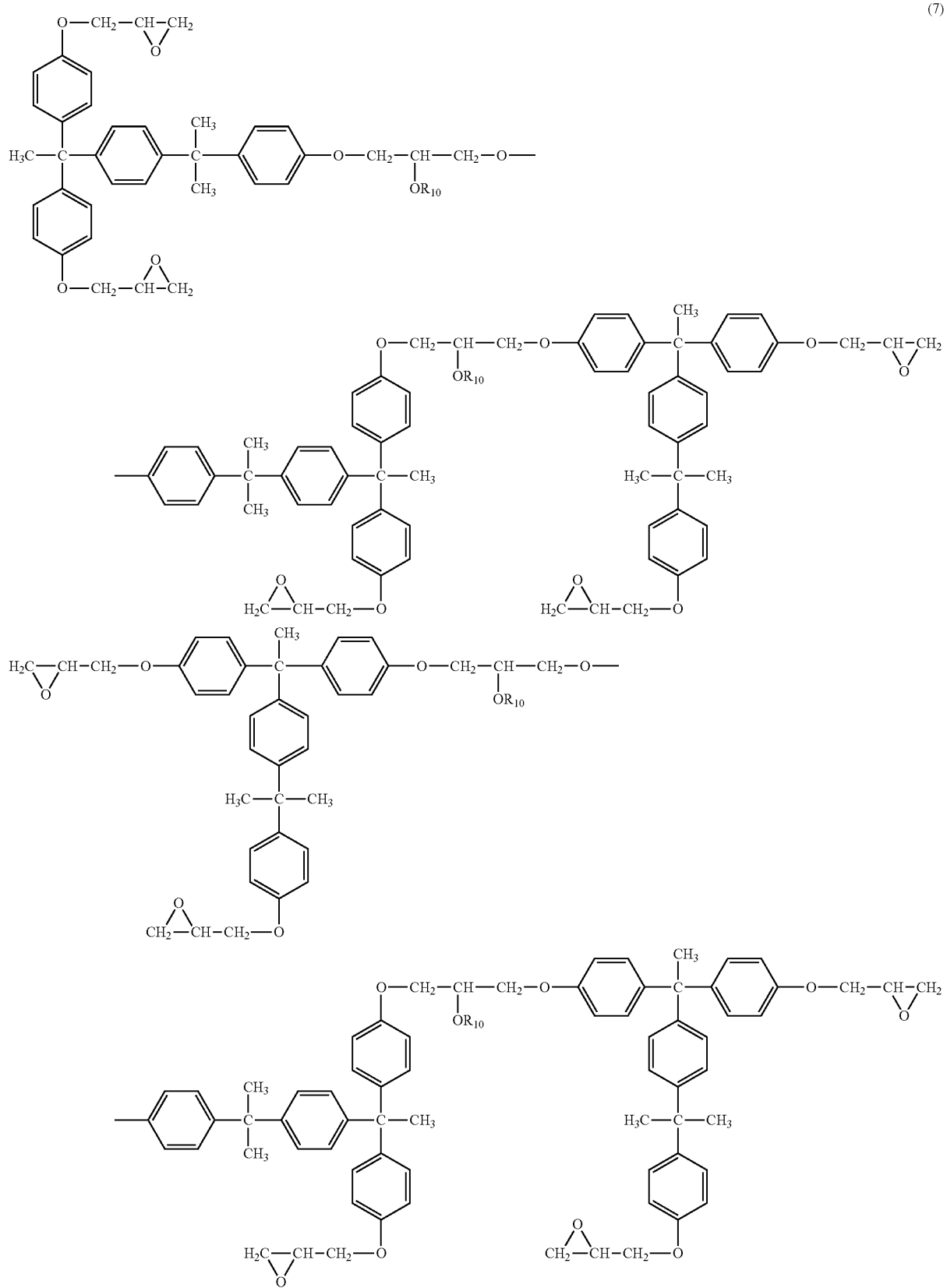

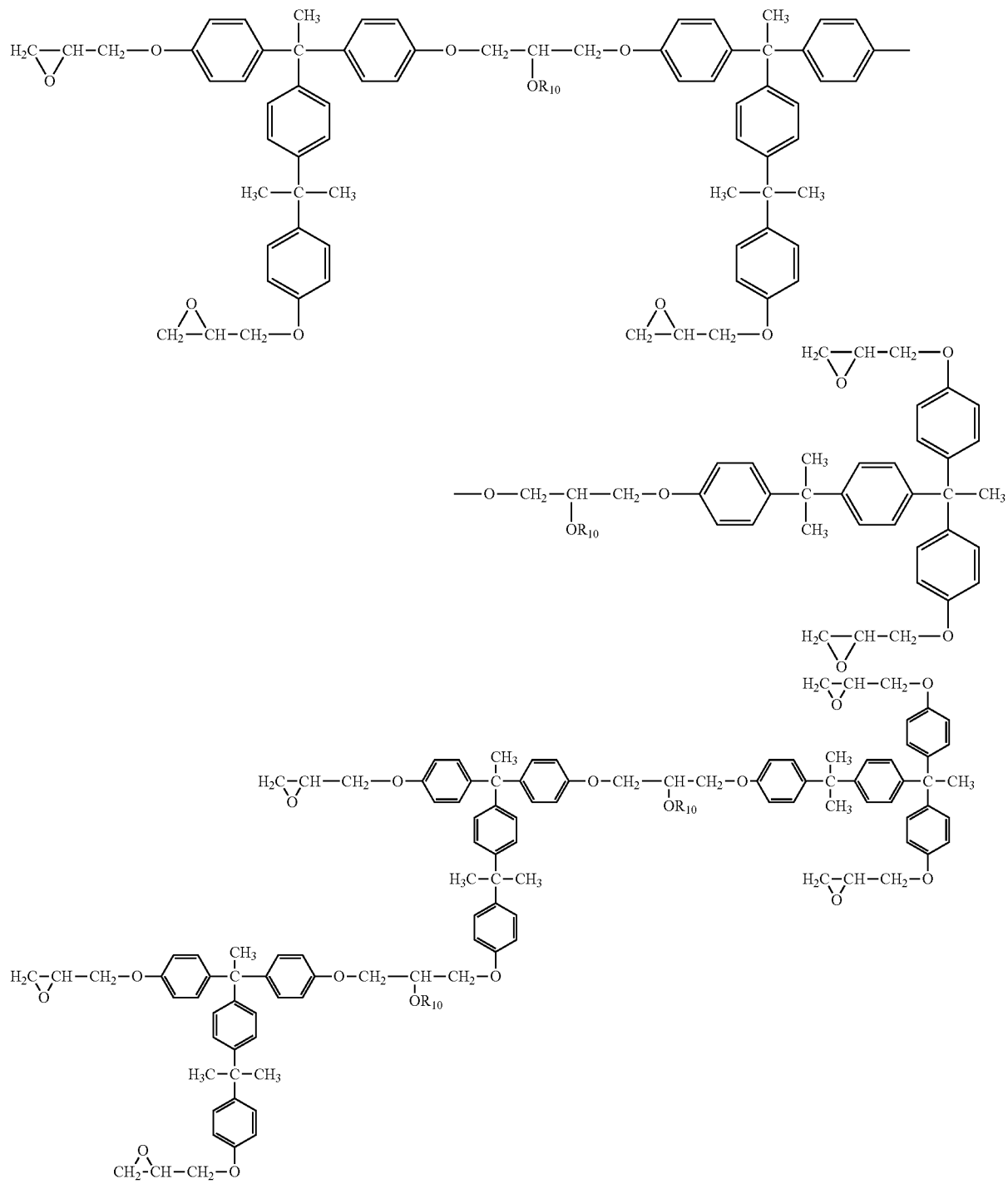
wherein, in the formula (6), $R_9$ each independently denotes a hydrogen atom or a glycidyl group, and, in the formula (7), $R_{10}$ each independently denotes a hydrogen atom or a glycidyl group;
an epoxy compound (b-5) that is a co-condensation product of a compound represented by following formula (8) and/or formula (9), and a compound represented by following formula (10) and/or formula (11);
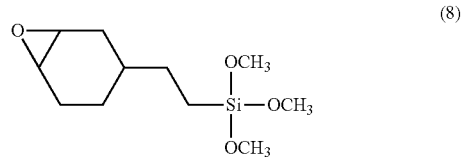
(8)

-continued

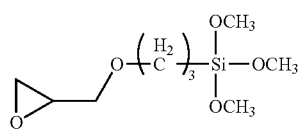
(9)

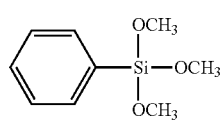
(10)

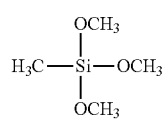
(11)

an epoxy compound (b-6) represented by a following formula (12)

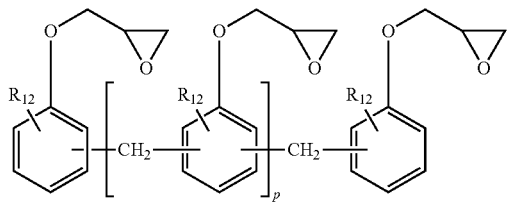
(12)

wherein $R_{12}$ each independently denotes an alkyl group having 2 to 4 carbon atom(s), and p is an average repetition number and denotes a real number in a range of from 0 to 10;

an epoxy compound (b-7) represented by a following formula (13),

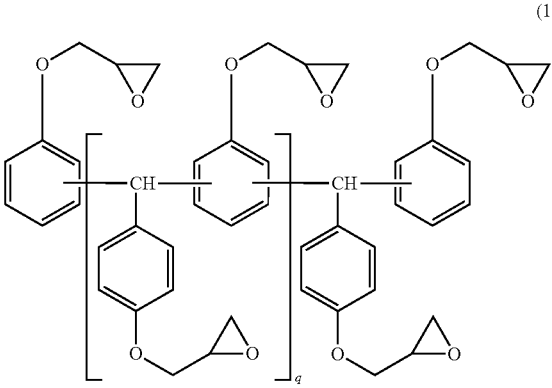
(13)

wherein q is an average repetition number and denotes a real number in a range of from 0 to 5;
and
an epoxy compound (b-10) represented by a following formula (16),

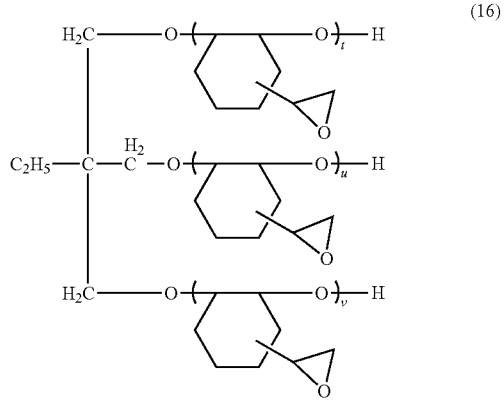
(16)

wherein t, u and v each is an average repetition number and denotes a real number satisfying a relation of $2 \le t+u+v \le 60$.

26. The photosensitive resin composition according to claim 25, wherein the epoxy resin (B) further comprises an epoxy compound (b-2) represented by a following formula (3),

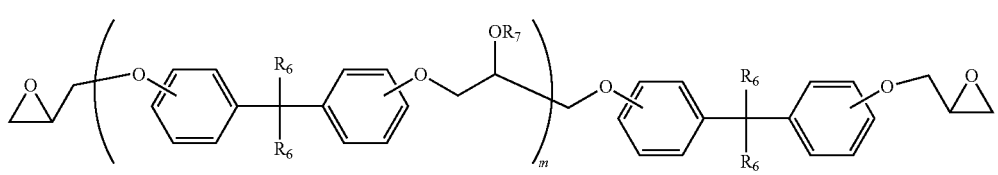
(3)

wherein $R_6$ each independently denotes an alkyl group having 2 to 4 carbon atom(s), or a trifluoromethyl group, $R_7$ denotes a hydrogen atom, and m is an average repetition number and denotes a real number in a range of from 1 to 30.

* * * * *

UNITED STATES PATENT AND TRADEMARK OFFICE
CERTIFICATE OF CORRECTION

| | | |
|---|---|---|
| PATENT NO. | : 11,809,078 B2 | Page 1 of 1 |
| APPLICATION NO. | : 16/769361 | |
| DATED | : November 7, 2023 | |
| INVENTOR(S) | : Naoko Imaizumi | |

It is certified that error appears in the above-identified patent and that said Letters Patent is hereby corrected as shown below:

On the Title Page

Please correct the Applicant's name to read as follows:
-- (71) Applicant: Nippon Kayaku Kabushiki Kaisha --

Signed and Sealed this
Ninth Day of January, 2024

Katherine Kelly Vidal
*Director of the United States Patent and Trademark Office*